US008732559B2

(12) United States Patent
Liu et al.

(10) Patent No.: US 8,732,559 B2
(45) Date of Patent: May 20, 2014

(54) RECOVERY FROM BURST PACKET LOSS IN INTERNET PROTOCOL BASED WIRELESS NETWORKS USING STAGGERCASTING AND CROSS-PACKET FORWARD ERROR CORRECTION

(75) Inventors: Hang Liu, Yardley, PA (US); Liqiao Han, Somerset, NJ (US); Mingquan Wu, Plainsboro, NJ (US); Dekai Li, Yardley, PA (US); Kumar Ramaswamy, Princeton, NJ (US)

(73) Assignee: Thomson Licensing, Issy les Moulineaux (FR)

( * ) Notice: Subject to any disclaimer, the term of this patent is extended or adjusted under 35 U.S.C. 154(b) by 895 days.

(21) Appl. No.: 12/309,507

(22) PCT Filed: Jul. 25, 2006

(86) PCT No.: PCT/US2006/028920
§ 371 (c)(1),
(2), (4) Date: Jan. 21, 2009

(87) PCT Pub. No.: WO2008/013528
PCT Pub. Date: Jan. 31, 2008

(65) Prior Publication Data
US 2009/0327842 A1    Dec. 31, 2009

(51) Int. Cl.
*H03M 13/00* (2006.01)
(52) U.S. Cl.
USPC .......................................... 714/776; 714/755
(58) Field of Classification Search
CPC .................... H03M 13/6519; H03M 13/6527; H03M 13/6538; H03M 13/6522; H03M 13/6508; H04L 1/0079
USPC .................................................. 714/755, 776
See application file for complete search history.

(56) References Cited

U.S. PATENT DOCUMENTS 3,882,457 A * 5/1975 En .................................. 714/788
5,399,912 A * 3/1995 Murata et al. ................... 327/94
(Continued)

FOREIGN PATENT DOCUMENTS

| JP | 9326172 A | 12/1997 |
|----|-----------|---------|
| JP | 2003092564 A | 3/2003 |

(Continued)

OTHER PUBLICATIONS

Bakshi et al., "Providing Seamless Communication in Mobile Wireless Networks", 21st IEEE Conference on Local Computer Networks, pp. 535-543, Los Alamitos, CA, USA, Oct. 13, 1996.

(Continued)

*Primary Examiner* — Joseph D Torres
(74) *Attorney, Agent, or Firm* — Robert S. Shedd; Jeffrey M. Navon; Catherine A. Cooper

(57) ABSTRACT

A method and system for transmitting data are described including packetizing the data, performing forward error correction (FEC) encoding on the packetized data in order to generate a parity packet, appending FEC information as padding to the end of payload data of the packetized data and transmitting the packetized data and the at least one parity packet. Also described are a method and system for recovering from loss of a packet including receiving a data packet, receiving a parity packet, buffering the received data packet, detecting packet loss, forward error correction decoding the parity packet to recover from packet loss using forward error correction information extracted from the data packet and from the parity packet and forwarding the recovered packet via an internal socket. Also described is a method for staggercasting.

7 Claims, 18 Drawing Sheets

(56) References Cited

U.S. PATENT DOCUMENTS

| | | | |
|---|---|---|---|
| 5,509,020 A * | 4/1996 | Iwakiri et al. | 714/704 |
| 6,055,236 A * | 4/2000 | Nessett et al. | 370/389 |
| 6,145,109 A * | 11/2000 | Schuster et al. | 714/752 |
| 6,421,387 B1 * | 7/2002 | Rhee | 375/240.27 |
| 6,487,690 B1 * | 11/2002 | Schuster et al. | 714/752 |
| 6,707,801 B2 * | 3/2004 | Hsu | 370/312 |
| 6,745,364 B2 | 6/2004 | Bhatt et al. | |
| 6,831,932 B1 * | 12/2004 | Boyle et al. | 370/539 |
| 6,877,043 B2 * | 4/2005 | Mallory et al. | 709/251 |
| 6,882,634 B2 * | 4/2005 | Bagchi et al. | 370/338 |
| 6,888,844 B2 * | 5/2005 | Mallory et al. | 370/466 |
| 6,891,881 B2 * | 5/2005 | Trachewsky et al. | 375/143 |
| 6,898,204 B2 * | 5/2005 | Trachewsky et al. | 370/445 |
| 6,909,702 B2 * | 6/2005 | Leung et al. | 370/278 |
| 6,934,756 B2 * | 8/2005 | Maes | 709/227 |
| 6,954,800 B2 * | 10/2005 | Mallory | 709/240 |
| 6,970,935 B1 * | 11/2005 | Maes | 709/230 |
| 6,975,655 B2 * | 12/2005 | Fischer et al. | 370/516 |
| 6,988,236 B2 * | 1/2006 | Ptasinski et al. | 714/758 |
| 6,993,101 B2 * | 1/2006 | Trachewsky et al. | 375/343 |
| 7,000,031 B2 * | 2/2006 | Fischer et al. | 709/248 |
| 7,035,285 B2 * | 4/2006 | Holloway et al. | 370/474 |
| 7,095,729 B2 * | 8/2006 | Sachs et al. | 370/341 |
| 7,318,187 B2 * | 1/2008 | Vayanos et al. | 714/776 |
| 7,343,540 B2 | 3/2008 | Khermosh et al. | |
| 7,376,880 B2 * | 5/2008 | Ichiki et al. | 714/751 |
| 7,388,853 B2 * | 6/2008 | Ptasinski et al. | 370/338 |
| 7,406,106 B2 * | 7/2008 | Mallory | 370/522 |
| 7,409,627 B2 | 8/2008 | Kim et al. | |
| 7,430,617 B2 * | 9/2008 | Walsh et al. | 709/247 |
| 7,587,207 B2 | 9/2009 | Davies et al. | |
| 7,660,245 B1 * | 2/2010 | Luby | 370/230 |
| 7,751,324 B2 * | 7/2010 | Vadakital et al. | 370/231 |
| 7,853,856 B2 * | 12/2010 | Vedantham et al. | 714/776 |
| 7,864,805 B2 * | 1/2011 | Hannuksela | 370/473 |
| 7,904,781 B2 | 3/2011 | Sugai et al. | |
| 7,933,295 B2 * | 4/2011 | Thi et al. | 370/493 |
| 7,965,729 B2 * | 6/2011 | Veeraraghavan et al. | 370/428 |
| 2002/0159410 A1 | 10/2002 | Odenwalder et al. | |
| 2007/0011556 A1 * | 1/2007 | Gentric | 714/752 |
| 2007/0250752 A1 * | 10/2007 | Prosch et al. | 714/752 |

FOREIGN PATENT DOCUMENTS

| | | |
|---|---|---|
| JP | 2004032719 A | 1/2004 |
| JP | 2004502341 A | 1/2004 |
| JP | 2005524281 A | 8/2005 |
| WO | 2005022814 A1 | 3/2005 |
| WO | WO2006030329 | 3/2006 |
| WO | 2006/061902 A | 6/2006 |

OTHER PUBLICATIONS

Rosenberg et al., "An RTP Payload Format for Generic Forward Error Correction", RFC2733, IETF, Dec. 1999, Sections 3, 4, and 8: Basic Operation, Parity Codes and Recovery Procedures, 24 pages.

Tan et al., "Video Multicast using Layered FEC and Scalable Compression", IEEE Transactions on Circuits and Systems for Video Technology, vol. 11, No. 3, Mar. 2001, pp. 373-386.

International Search Report, dated Feb. 26, 2007.

Chou et al., "Error Control for Receiver-Driven Layered Multicast of Audio and Video", IEEE Transactions on Multimedia, vol. 3, No. 1, Mar. 2001.

Supplementary European Search Report for EP06774691 dated Feb. 1, 2012.

* cited by examiner

RECOVERY FROM BURST PACKET LOSS IN INTERNET PROTOCOL BASED WIRELESS NETWORKS USING STAGGERCASTING AND CROSS-PACKET FORWARD ERROR CORRECTION

This application claims the benefit, under 35 U.S.C. §365 of International Application PCT/US2006/028920 filed Jul. 25, 2006, which was published in accordance with PCT Article 21(2) on Jan. 31, 2008 in English.

FIELD OF THE INVENTION

The present invention relates to wireless networking and in particular, to recovery from random and burst packet loss using staggercasting in combination with cross-packet forward error correction.

BACKGROUND OF THE INVENTION

Although wireless local area networks (WLANs) were initially designed for data communications, interests and demands for WiFi multimedia applications are growing rapidly. Video multicasting over IEEE 802.11 WLANs enables efficient distribution of live video or pre-recorded entertainment programs to many receivers simultaneously. However, digital video delivery requires high reliability, bounded delay and bandwidth efficiency. Wireless links are unreliable with time-varying and burst link errors. Specifically, in video multicast applications, different receivers of the same video may experience heterogeneous channel conditions. Receivers may also leave or join during the session so that the topology of network changes. In addition, there is no link layer retransmission and no link layer adaptation for multicasting in the current IEEE 802.11 standards. Erroneous packets are simply dropped. It appears to the application layer as a packet erasure channel. Packet loss can be detected by checking the sequence number field of the packet header. Therefore, it is important and a challenging task to support quality of services (QoS) for all the receivers of the multicast video in the desired serving area while efficiently utilizing the available WLAN resources.

In video multicast/broadcast over IP-based wireless networks, video data is encapsulated in UDP/IP packets and multicast/broadcast to the mobile devices over wireless networks. The IP-based wireless networks can be wireless local area networks (WLANs), cellular networks, wireless metropolitan area networks (WMANs) and wireless regional area networks (WRANs). When a mobile device moves from one cell to another, it is handed-over/handed-off from the base station (BS)/access point (AP) with which it is currently associated to another BS/AP. The two BSs/APs generally operate at different frequencies/channels. A number of packets are lost when the mobile device changes operating frequency to associate with the new BS/AP.

Typically, a broadcast signal is transmitted to all possible receivers simultaneously. A multicast signal is transmitted to a selected subset (one or more) of all possible receivers in a group simultaneously. As used herein multicast also includes broadcast. That is, a multicast signal may be transmitted to a selected subset of all possible receivers in a group where the selected subset may include the entire set of all possible receivers, i.e. the multicast group is all receivers.

In wireless systems, channel coding is used at the physical layer to protect packets against multipath lading and interference. However, channel coding within a packet cannot recover packet loss during handovers/handoffs.

One prior art method provides for transmission of duplicate data time-delayed/time-shifted from the original data (staggercasting) in an ATSC system to improve broadcast system robustness. When duplicate, time-staggered streams are sent, the system can tolerate signal loss up to the duration of the time shift between the two streams. Another prior art method provides a lower bit rate version of the original data (instead of the exact original data) is repetitively transmitted with a time delay. This approach reduces the bandwidth used by the redundant data. However, both of these prior art schemes send a composite signal and always send the signals whether or not there are any clients/receivers that want/need the data.

Yet another prior art method provided for the use of cross-packet forward error correction (FEC) codes to protect against synchronization loss in an ATSC system. FEC codes have also been used to recover lost packets in IP-based wireless networks. In general, an erroneous packet is discarded by the link layer. The FEC codes are applied across data packets at the transport and application layers and erasure decoding is used to recover the lost packets. However, the FEC parity packets are generally sent together with the data packet. During handoffs/handovers, long error bursts may occur. These long error bursts lead to the loss of data packets and parity packets exceeding the FEC capability, so that the lost data packets cannot be recovered.

There has been a great deal of research and theoretical analysis/simulations on various application layer forward error correction (FEC) and automatic repeat request (ARQ) algorithms to recover from packet loss and to improve transmission reliability in wireless networks. Another prior art method described an ACK-based hybrid ARQ algorithm for unicast video transmission and progressive video coding with FEC (MDFEC) for multicast video transmission over WLANs. Yet another prior art method provided receiver-driven FEC schemes for multicast in a wired Internet environment, in which FEC packets are delayed from the video packets. However, this method focused on how to optimize the performance of the heterogeneous receivers in a wired Internet environment.

The problem addressed and solved by the present invention is how to recover from random and burst packet loss, and achieve seamless handoffs to ensure high-quality video multicast/broadcast over IP-based wireless networks.

SUMMARY OF THE INVENTION

In wireless networks, a mobile device may experience random and burst packet loss. This may be due to hand-over/hand-off from one base station/access point to another base station/access point. The data transmitted during these periods are lost to the receiver/mobile device. The present invention provides a method and apparatus to recover from data packet loss for seamless handoff/handover by repeatedly transmitting data packets and cross-packet FEC parity packets with a time shift (staggercasting). No consideration was given in the prior art as to how to recover if all the video packets in a coding block are lost, which may occur during burst packet loss, e.g. during handoff in wireless networks or as a result of shadowing. Also no consideration was given in the prior art methods as to how to synchronize the video packets and the parity packets in an FEC coding block at the receiver and how padding information in a packet is communicated, as well as how to support the legacy non-FEC capable receivers for backward compatibility.

The system described herein includes one or more server(s)/sender(s)/transmitter(s), wireless base stations or access points, Ethernet switches, and receivers. A receiver as used herein is typically a mobile device. Mobile devices include, but are not limited to, mobile telephones, cellular telephones, mobile terminals, video players, personal digital assistants (PDAs) and laptops.

The normal/original data and the time-shifted parity data are transmitted in a backwards compatible manner using different IP multicast groups. That is, if a mobile device does not have the capability provided in the present invention, it can still receive and decode the normal data packets alone with low system resilience to packet loss. The delayed parity packets are discarded by the mobile device. This achieves backward compatibility with legacy devices.

The present invention is an application layer staggered FEC scheme that is able to recover from random and burst packet loss. In particular, the present invention achieves seamless service (i.e. no video glitch) during random and burst packet loss. The present invention takes video multicasting characteristics into account and provides an application layer solution for seamless handoffs. If multiple video packets are completely lost in a burst, the lost packets can be recovered from the corresponding FEC parity packets alone.

A method and system for transmitting data are described including packetizing the data, performing forward error correction (FEC) encoding on the packetized data in order to generate at least one parity packet, appending FEC information as padding to the end of payload data of the packetized data and transmitting the packetized data and a parity packet. Also described are a method and system for recovering from loss of a packet including receiving a data packet, receiving at least one parity packet, buffering the received data packet, detecting packet loss, forward error correction decoding the at least one parity packet to recover from packet loss using forward error correction information extracted from the data packet and from the at least one parity packet and forwarding the recovered packet via an internal socket. Also described is a method for staggercasting including encoding and compressing a first data sequence, packetizing the compressed encoded data sequence to form a data packet, performing forward error correction (FEC) encoding on the data packet in order to generate a second data sequence related to the first data sequence, appending FEC information as padding to the end of payload data of the data packet, packetizing the second data sequence to form a packet, multicasting the data packet to a first multicast group and multicasting the packet formed using the second data sequence delayed by an offset time to a second multicast group.

BRIEF DESCRIPTION OF THE DRAWINGS

The present invention is best understood from the following detailed description when read in conjunction with the accompanying drawings. The drawings include the following figures briefly described below where like-numbers on the figures represent similar elements.

DETAILED DESCRIPTION OF THE PREFERRED EMBODIMENTS

The present invention is directed to staggercasting in wireless networks to recover from the random and burst data packet loss. This is accomplished by transmitting data packets and cross-packet FEC parity packets with a time shift/time delay. The present invention is independent of video coding schemes. The present invention can also be used to transmit audio streams although video multicast over wireless networks is used as an example to explain the invention.

Figure 1:
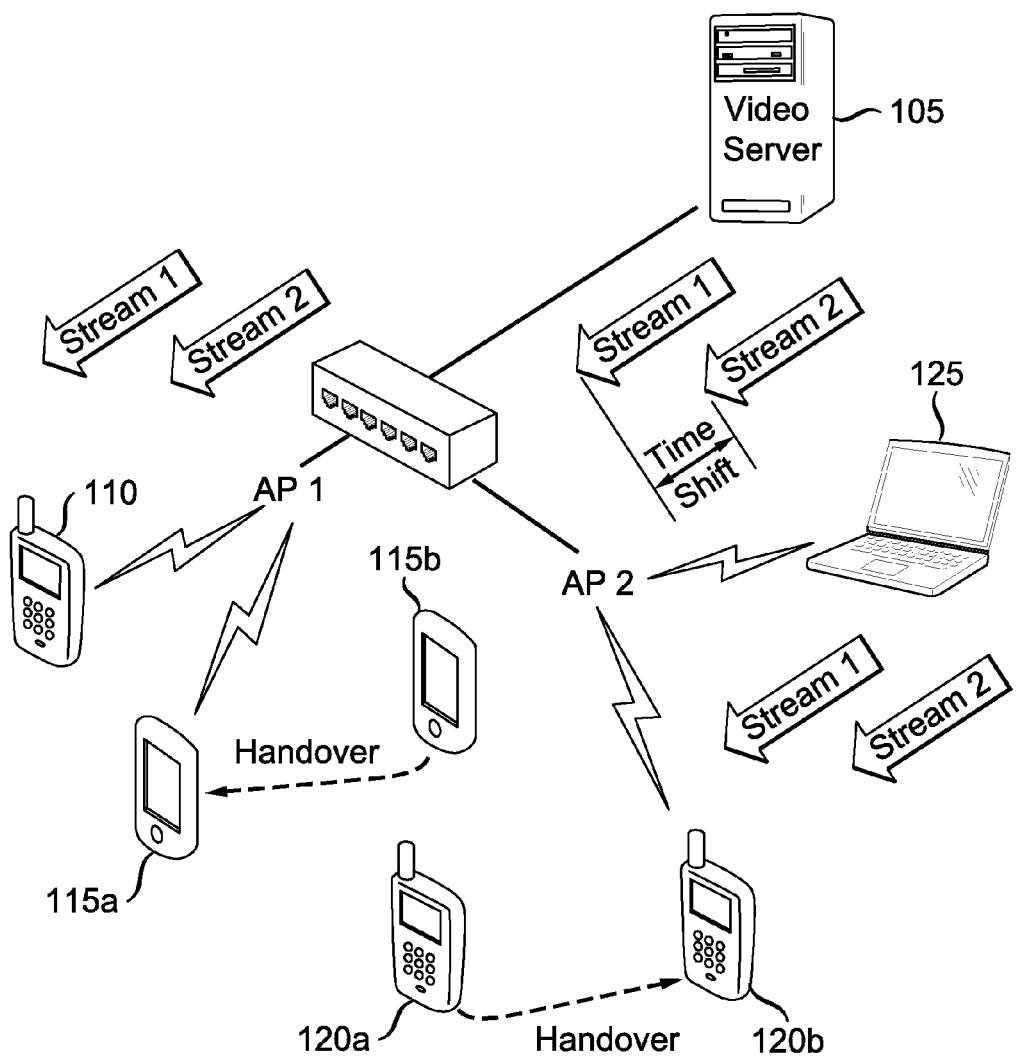
FIG. 1 is a schematic diagram of a multicast system in an internet protocol based wireless network using staggercasting.

Referring to FIG. 1, a typical network system in accordance with the present invention is shown. Multiple base stations/access points AP1, AP2 form a cellular network to increase the coverage. To reduce the interference, the adjacent wireless base stations/access points AP1/AP2 are operated in different frequency carriers/wireless channels. At least one video server 105 is connected to multiple wireless base stations (BSs) or access points (APs) through high-speed Ethernet LANs or other wired high-speed networks. The video server 105 includes among other components a video encoder/transcoder and a packetizer. For live video multicast/broadcast, the video content are encoded/transcoded, packetized and then multicast to a number of mobile clients (110, 115a, 115b, 120a, 120b, 125) through wireless base stations/access points AP1, AP2. Pre-coded video content can also be packetized and then multicast to a number of mobile clients through wireless base stations/access points.

When a mobile device (e.g., 115a, 120b) moves from one cell to another, the mobile device is handed-over/handed-off from the base station (BS)/access point (AP) with which it is currently associated to another BS/AP. A number of packets may be lost when the mobile device (315a, 120b) changes its operating frequency to associate with the new BS/AP. To recover from packet loss and achieve seamless handover, the present invention provides for simulcasting the video content (data packets) and the parity packets generated from data packets by a FEC code, for example a half-rate Reed-Solomon code with a time shift. The normal video packet stream is sent to all the base stations/access points in an IP multicast group (normal video multicast group). In addition, the time-staggered/shifted/delayed FEC stream is sent to all the mobile devices in another IP multicast group (delayed recovery multicast group). This technique is called staggercasting herein. The normal video stream and the time-shifted FEC stream provide time-diversity to improve system robustness in the handover/handoff situation. The system can transparently tolerate the packet loss up to the duration of time shift.

A mobile device may join a video group only. When a mobile device is handed-off from a BS/AP to an adjacent BS/AP, the mobile device sends a request to the new BS/AP to join/subscribe to both the normal video multicast group and the delayed FEC multicast group either when an error is detected or as soon as a handoff/handover situation occurs. The new BS/AP transmits/multicasts both the normal video packet stream and the delayed FEC packet stream in multicast over the wireless link. The mobile device receives both of the streams. If the join time is less than the time shift between the video stream and FEC parity streams, the corresponding parity packets will be received by the mobile device to recover lost video packets. If the mobile device detects that some packets are lost in the normal video packet stream, then the mobile device switches to the time-delayed FEC packet stream to recover the lost packets. If the time shift duration/period between the normal video packet stream and the delayed FEC stream is greater than the handoff lime (or the burst), the lost video data can be recovered. After the lost data in the normal video packet stream are recovered, the mobile device can send a request to the BS/AP to leave/unsubscribe/exit the delayed FEC multicast group. If no mobile device associated with a BS/AP wants the data for a multicast group (normal video data or delayed FEC data), i.e. there are no members of a multicast group, the BS/AP will not transmit data for this multicast group in wireless networks, but discards the data. This saves wireless bandwidth. The Internet Multicast Management Protocol (IGMP) or other protocols can be used for the mobile device to request the BS/AP to join or leave a multicast group. In an alternative embodiment, the mobile device sends the request to the Ethernet switch to join or leave a multicast group. If no mobile device associated with a BS/AP wants the data for a multicast group, the Ethernet switch will not transmit the data for that multicast group to the BS/AP.

In particular, still referring to FIG. 1, mobile device 115b moves from a cell serviced/supported by AP2 to a cell serviced/supported by AP1. In so doing, mobile device (now 115a—supported by AP1) requests AP1 to join/subscribe to the normal video and delayed FEC multicast groups, and receives both the normal video packet stream (stream 1) and the delayed/time-shifted FEC stream (stream 2). If errors are detected (some packets are lost) in the normal video packet stream, then the mobile device switches to the time-delayed FEC packet stream to recover the lost packets. If the time shift duration between the normal video packet stream and the delayed FEC stream is greater than the handoff time, the corresponding parity packets received are used to recover lost video packets. After the lost data in the normal video packet stream are recovered, the mobile device 115a can send a request to the BS/AP to leave/unsubscribe/exit the delayed video multicast group.

Similarly, mobile device 120a moves from a cell serviced/supported by AP1 to a cell serviced/supported by AP2. In so doing, mobile device (now 120b—supported by AP2) requests AP2 to join/subscribe to the normal and delayed video multicast groups, and receives both the normal video packet stream (stream 1) and the delayed/time-shifted FEC stream (stream 2). If errors are detected (some packets are lost) in the normal video packet stream, then the mobile device switches to the time-delayed FEC packet stream to recover the lost packets. If the time shift duration between the normal video packet stream and the delayed FEC stream is greater than the handoff lime, the corresponding parity packets received are used to recover lost video packets. After the lost data in the normal video packet stream are recovered, the mobile device 120b can send a request to the BS/AP to leave/unsubscribe/exit the delayed video multicast group.

Any systematic FEC code, for example, Reed-Solomon (RS) codes can be used with the erasure decoding to recover the lost packets. In an exemplary embodiment, FEC parity packets generated by a cross-packet forward error correction coding at the video streaming server are transmitted to the delayed recovery IP multicast group. Note that an FEC code is applied across the video packets (cross-packet) to produce parity packets. The reason is that if the FEC coding is applied within a single packet at the application layer, the erroneous packet is discarded by the receiving MAC layer and will not be available for error correction at the application layer. If a RS (N, K) code is applied across the K video packets to produce (N–K) parity packets. As long as at least K (no matter video or parity packets) packets in each coding block are received correctly, the original K video packets can be recovered.

An FEC code is applied to the video data packets to generate the parity packets. The video packet stream and the parity packet stream are multicast with a time shift to different IP multicast groups, i.e. staggercasting the video stream and the parity stream for temporal diversity. Specifically, the original video packet stream and the additional FEC parity packet stream are transmitted to all the BSs/APs in different IP multicast groups with a time shift by the video/streaming server over Ethernet, i.e. staggercasting the video stream and FEC parity stream. Each BS/AP then sends the video stream and the FEC parity stream in multicast over the WLAN. The normal video stream and the time-shifted parity stream thus provide temporal diversity to improve the video multicast robustness.

Figure 2:
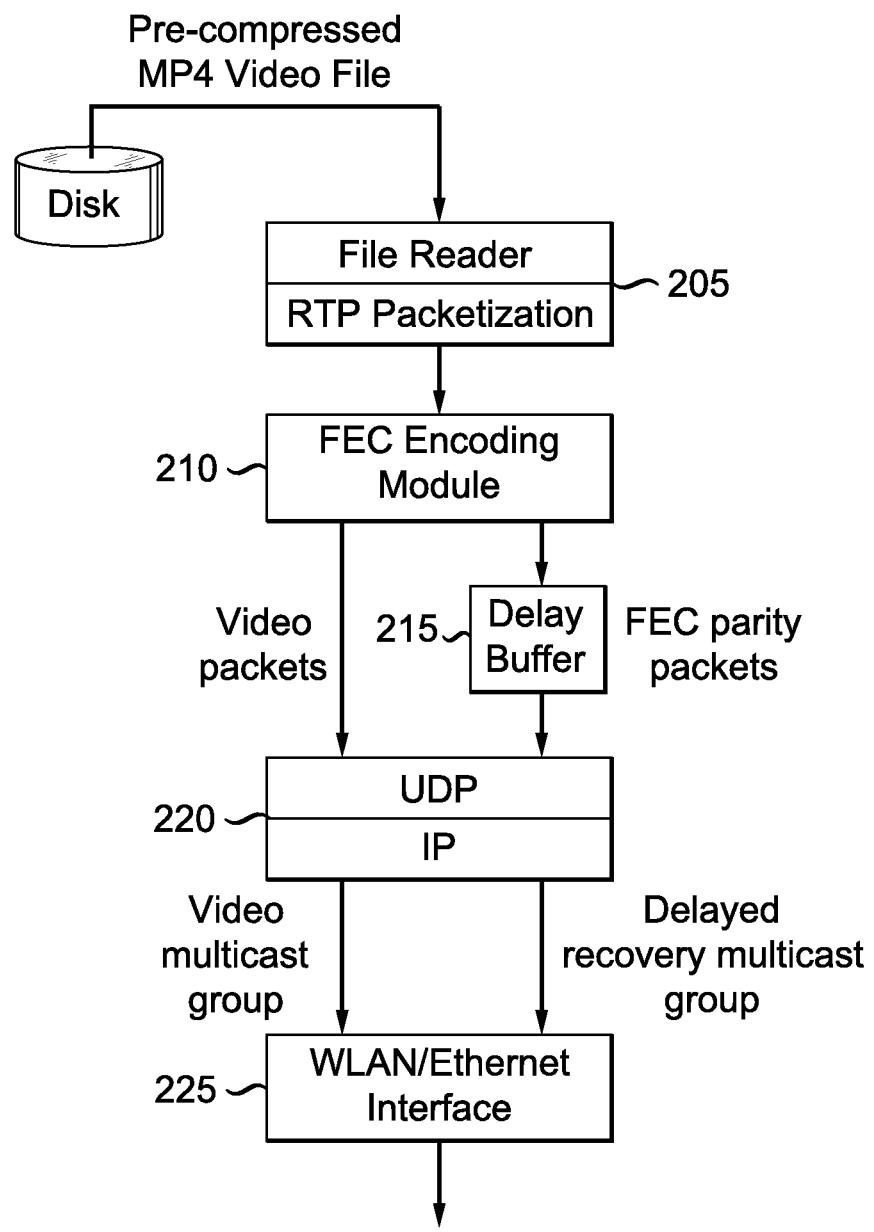
FIG. 2 is a schematic diagram of an exemplary video sever/sender architecture.

FIG. 2 is a schematic diagram of an exemplary video sever/sender architecture. FIG. 2 shows a video sender/server implementation for a video multicast system using the staggered FEC in accordance with the present invention. The UDP/IP protocol stack 220 is used for video multicasting. The protocol stack actually includes RTP but the RTP portion of the protocol stack (packetization) 205 is split from the UDP/IP portion of the protocol stack and handled before the FEC encoding by the FEC encoding module 210. The video sequence is pre-compressed and stored in a file with MP4 format in this case. H.264 video coding is used in an exemplary embodiment of the present invention due to its compression efficiency. Other video coding schemes are possible. It is also possible that video is compressed in real time by a video encoder. The FEC encoding module 210 is placed after the RTP packetization 205, but before the UDP/IP layer 220. The compressed video is packetized by the RTP packetizer 205 and the RTP packet header is added. The FEC related control information is appended to the video packets as padding by the FEC encoding module 210 in accordance with the present invention. In conventional video packets (for example 3GPP packets), FEC coding information was inserted after the RTP header and before the RTP payload (video data). By moving the FEC control information as padding of the video packets, the packet format is backward compatible to non-FEC capable legacy players because padding will be ignored by these legacy players.

The systematic FEC codes are then applied across video packets at the FEC encoding module to generate parity packets. Reed-Solomon (RS) codes constructed using a Vandermonde matrix are used in an exemplary embodiment. For a RS (N, K) code, K video packets are grouped together. During the encoding, the RS code is applied to the packet group and one symbol from each packet consists of a codeword. (N−K) parity packets are generated from K video packets. To make decoding possible at the receiver, the header is added in the FEC packets containing FEC information. In an exemplary embodiment, FEC parameters N and K can all be dynamically adjusted in real time.

The video packets are transmitted in an IP multicast group (normal video multicast group) through the UDP/IP stack 220 and Ethernet interface 225 to the BSs/APs. The FEC parity packets are then stored in the delay buffer 215 for an offset time $T_d$. The FEC parity packets are transmitted in another IP multicast group (delayed recovery (FEC) multicast group) over UDP/IP stack 220 and Ethernet interface 225 to the BSs/APs after the delay.

Session Description Protocol (SDP) is used to indicate the video multicast group and the FEC multicast group information, including the multicast addresses, video coding format, FEC coding scheme, etc. as well as the association between the video stream and the parity packet stream. The SDP file can be downloaded by the client through the HyperText Transfer Protocol (HTTP) or Real Time Streaming Protocol (RTSP) protocol at the session start or announced by the streaming server via the Session Announcement protocol (SAP).

Figure 3:
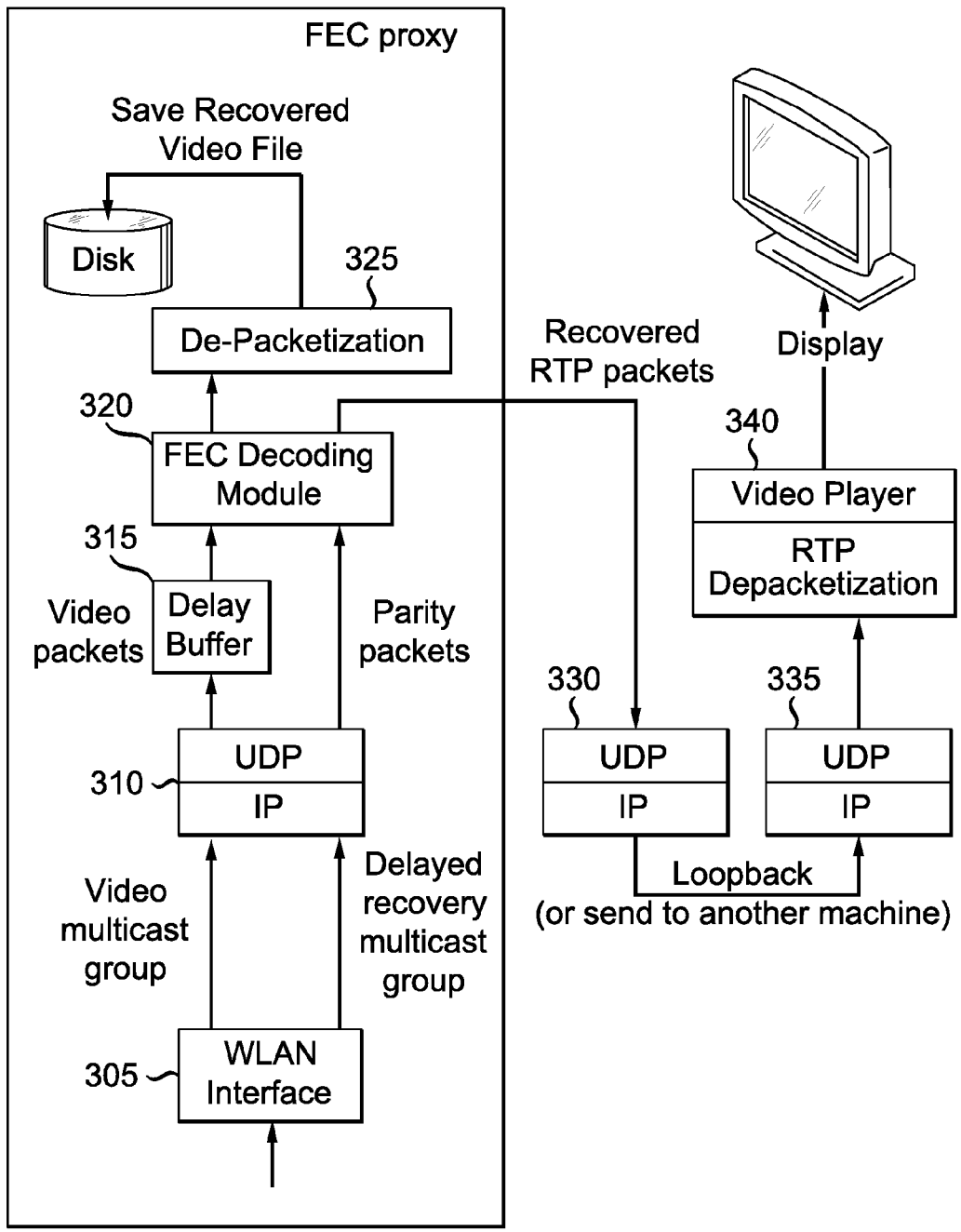
FIG. 3 is an exemplary client proxy architecture in accordance with the present invention.

Commercial and freeware video players, e.g. Quicklime and VLC players, are available, but these players do not support FEC coding. Source code is generally not available for commercial players and FEC support cannot be integrated. It is difficult to integrate support for FEC coding into every freeware player as well as maintain and update FEC coding support even if source code for freeware players is available. The present invention is directed to a client proxy architecture 300 as shown in FIG. 3. The client proxy architecture 300 of the present invention operates with any commercial and freeware video players. The client proxy receives video and FEC packets from different multicast groups, recovers lost video packets and sends the recovered video packets to the player through an internal socket.

FIG. 3 is an exemplary client proxy architecture in accordance with the present invention. The client proxy can be hardware, software, firmware, an application specific integrated circuit (ASIC), a reduced instruction set computer (RISC), a field programmable gate array (FPGA) or any combination thereof. The client proxy resides in and forms a part of a mobile device such as a video player. The normal video packets and the delayed parity (recovery) packets are received from different multicast groups by the client proxy via the WLAN interface 305 and the UDP/IP protocol stack 310. As on the video/streaming server side, the RTP portion of the protocol stack (de-packetization) 325 is split from the UDP/IP portion 310 of the protocol stack. The received video data packets are delayed in the buffer 315, which can be achieved, for example, by an initial playout delay. The FEC erasure decoding module 320 is placed after the UDP/IP stack 310. The erroneous packets are discarded by the link layer. The positions of lost video packets or parity packets are detected by the FEC erasure decoding module 320 through the sequence number in the packet header, which is used for erasure decoding. If a packet loss is detected, a request is sent to the BS/AP to join the delayed FEC multicast group to obtain the corresponding parity packets. The FEC header in the parity packets and in the video packets is used to determine the FEC block information by the FEC decoding module 320. With the RS (N, K) code, as long as any K or more packets out of N packets in a FEC coding block, regardless of the video data packets or parity packets, are correctly received, the FEC erasure decoding can reconstruct the original video packets in the case of all the packets padded to the longest packet during encoding at the sender. The FEC erasure decoding is a reverse process of the encoding, which is performed across the packets, one symbol from each packet to consist of the codeword. The padding is discarded from the recovered video/source packets after the video/source packets lost have been recovered using the FEC parity packets. The recovered video packets are sent to the video player 340 via an internal socket and UDP/IP stack 330. The recovered video packets may be received through one UDP/IP stack, e.g., UDP/IP stack 335 by the video player 340 in a loopback arrangement. The recovered video/data packets can also be forwarded to another video player. The video file is saved by RTP de-packetizer 325.

This FEC mechanism can be used in a multicast scenario with mixed FEC capable and non-FEC capable receivers because the original RTP video source packets are unchanged except for the FEC information used as padding. The padding information should be ignored by the non-FEC capable players based on RTP specification. If a mobile device does not have FEC capability, it can only receive the normal video packets from the video multicast group with low system resilience to packet loss. The parity packets in the different multicast group are discarded by the protocol stack. This achieves backward compatibility.

Burst packet losses may occur during mobile device handover. Some or all of the video packets in a coding block get lost during handover/handoff. A half-rate RS code is used to solve this issue in the present invention. For the RS code with erasure decoding, each parity packet can recover any one of the lost packets in the coding block. When a half-rate RS (N, K) code (N=2K) is applied to the K video packets, it generates K parity packets. With the half-rate RS code, even if video packets are completely lost in a burst during handover, the lost packets can be recovered from the corresponding parity packets alone. In this sense, the parity packet stream generated by the half-rate RS code is another description of the original video packet stream. The system can then transparently tolerate the burst packet loss up to the duration of time shift $T_d$ between the video stream and parity stream.

Figure 4:
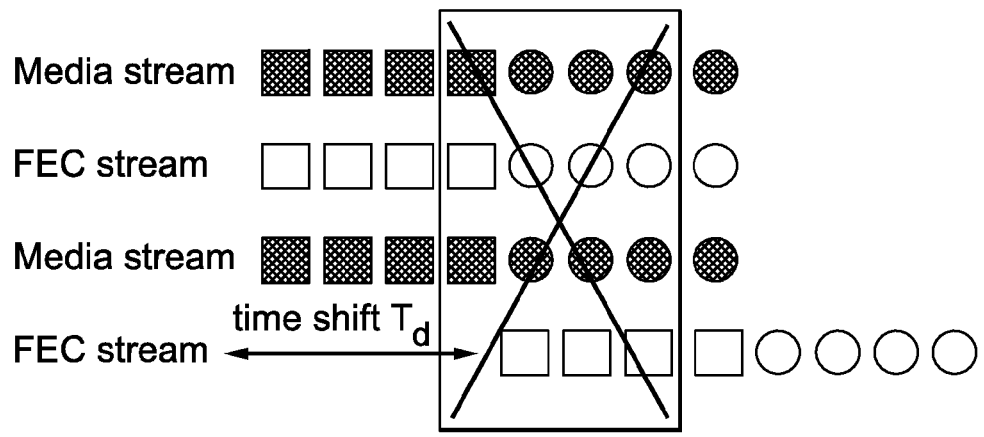
FIG. 4 is an example of the method of the FEC staggercasting of the present invention with K=4, N=8.

FIG. 4 is an example of the method of the FEC staggercasting for recovery of burst packet loss of the present invention with K=4, N=8. With a RS (8, 4) code, N−K=4 parity packets are generated from every K=4 source packets. The square packets belong to one FEC coding block and the oval packets belong to another FEC coding block. Both video and FEC parity packets may be lost during a burst such as handover. The receiver performs FEC erasure decoding on the received video packets and the corresponding parity packets. As long as at least K packets (video or parity packets) are received correctly, the original K source packets can be recovered. In the non-staggercasting case, the square block packets can be recovered because 6 packets (FEC and video) are received. But the oval block packets cannot be recovered because only 2 packets are correctly received. In the staggercasting case, there is a $T_d$ time difference between the video stream and the parity stream so that the location of lost packets is different in them. Because at least 4 packets are received for each block, both square and oval block packets can be recovered. Staggercasting achieves temporal diversity of the video stream and the parity stream.

The time shift $T_d$ between the information/video stream and the parity stream is a design parameter. It can be selected based on the duration of expected maximum packet burst loss due to handoff or shadowing. The expected length of handoff or shadowing loss should be less than $T_d$. Note that with half-rate RS code, the recoverable length of burst loss does not depend on the RS code parameters N and K. This provides flexibility in the system design. By adjusting the time shift $T_d$, the handover loss or shadowing loss can be recovered.

In implementations of RS codecs, for fast encoding and decoding, it is beneficial to choose a symbol length of 8-bits. This results in an RS code with a block length N≤255 octets. An exemplary embodiment of the present invention uses 1-byte symbols. RS codes of shorter block lengths and dimensions can be obtained by puncturing and shortening the mother code with N=255. A punctured code is a (N−L, K) code obtained from a (N, K) mother code; a shortened code is a (N−L, K−L) code obtained from a (N, K) mother code. An implementation of the present invention is based on a Vandermonde generator matrix for efficient erasure correction. A RS (N, K) codeword consists of K source symbols and (N−K) parity symbols. During the encoding process, the K×N Vandermonde generator matrix is transformed into its systematic version, where the first K columns form an identity matrix, and then the RS codeword is computed by multiplying a vector of K symbols with the systematic generator matrix. Since the code is systematic, the first K coded symbols are exactly the same as the original source symbols. During the decoding, a K×K sub-matrix is formed from the K columns of systematic Vandermonde matrix according to the positions of the received K symbols in the codeword. The sub-matrix is inverted and the original K source symbols are recovered by multiplying the vector of K received symbols with the inverted sub-matrix.

In order to prevent error propagation, each RTP/UDP/IP packet only contains the compressed data for a video coding unit (a video frame or a slice) so that the packet sizes vary. To maintain low decoding complexity, it is desirable that the matrix inversion is performed only once for each source block. Therefore, the locations of the received symbols need to be the same for all RS codeword rows in a source block. Padding is used to form a source block, wherein the packet sizes are consistent.

Figure 5:
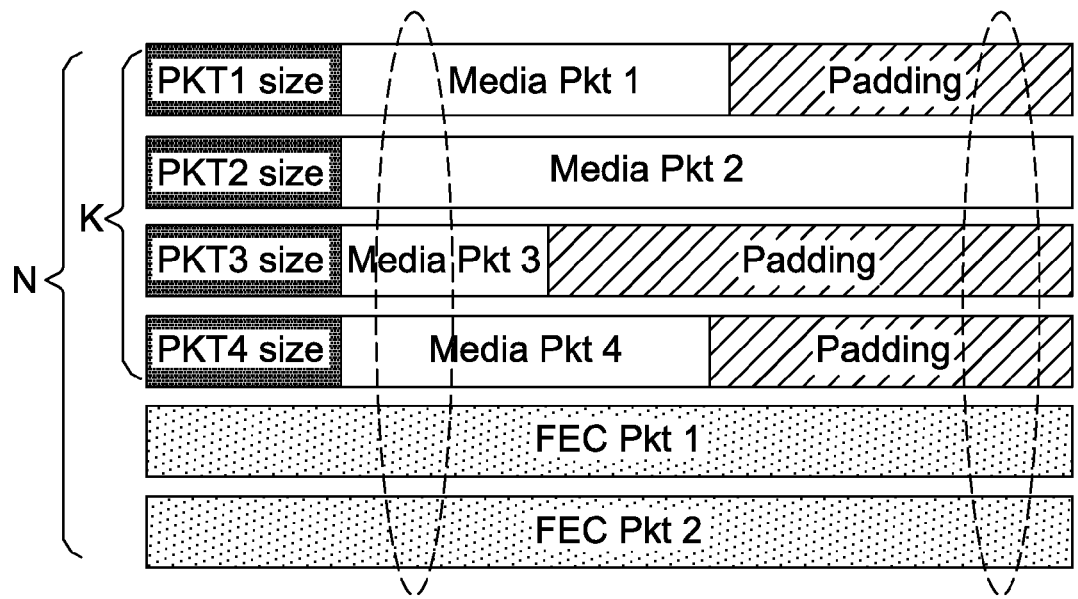
FIG. 5 shows a conventional padding scheme for RS coding.

One padding approach is shown in FIG. 5. Before FEC code is applied, the shorter packets in a source coding block are zero-padded so that their length becomes equal to the length of the largest packet in the source coding block. The two-byte RTP packet size field is inserted before each source packet during the FEC encoding so that the decoder knows the number of padding symbols in a recovered source packet. Note that the packet size field is not transmitted because the packet size can be obtained from the IP layer by the decoder. During the encoding, multiple codewords are computed across the padded packets, each codeword consisting of one symbol from each padded packet. If a RS (N, K) code is used, (N−K) parity packets are generated from K source packets. If the packet size variation is too large, this padding approach results in significant amount of padding so that a large portion of FEC overhead is used to protect the padding symbols. Although the padding symbols are not transmitted, FEC performance is reduced.

Figure 6:
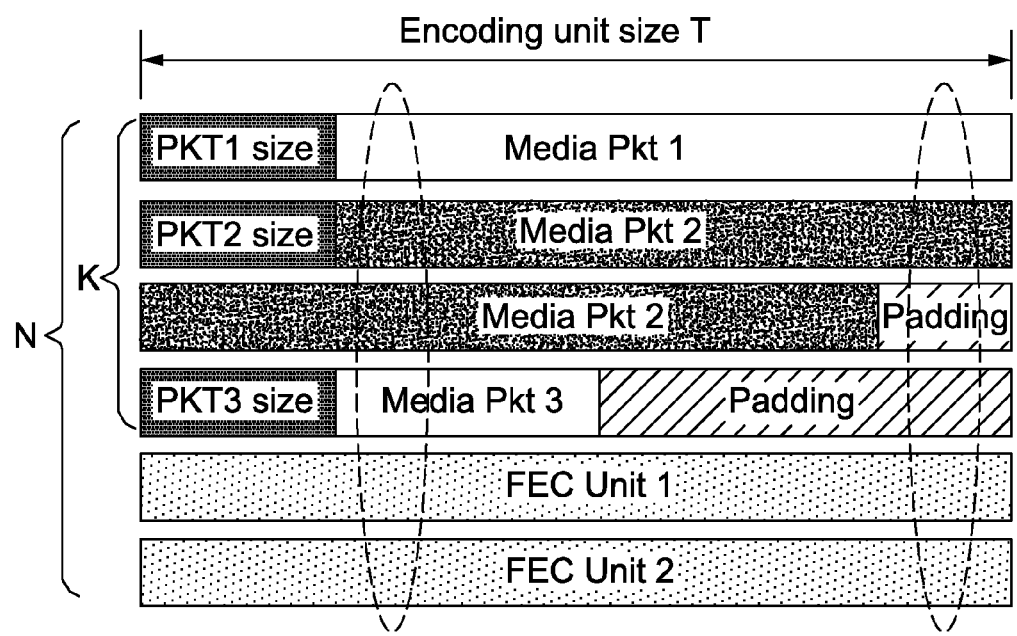
FIG. 6 shows a conventional hybrid padding scheme for RS coding.

Another padding approach, called hybrid padding, is shown in FIG. 6. The large packets are wrapped across multiple rows in the matrix. The size of each row for a coding block, called coding unit size U, can be determined to minimize the padding overhead. This padding approach reduces the total amount of padding and still has low decoding complexity for variable size packets. Each source packet starts with a new row in the source block. If the packet length is not a multiple of row length, padding symbols are appended to the end of the row. Note that the padding symbols are used only to compute the parity packets. The padding symbols are stripped off the video/source packets before transmitting the packets by the FEC encoding module. The number of source block rows should be equal to or less than K. A two-byte RTP packet size field is inserted before each source packet during the FEC encoding so that the decoder knows the number of padding symbols in a recovered video/source packet. The packet size field is not transmitted because the packet size can be obtained from the IP layer by the decoder.

The RS (N, K) code is applied along the column, i.e. a codeword consisting of one symbol from each column. This padding approach maintains the low decoding complexity. Only one matrix inversion is required to decode a source block because the locations of the lost symbols are the same for all columns of RS codewords in a source block. Note that the standard padding approach is a special case with the row size equal to maximum packet length. A parity packet may contain one or multiple rows of coded parity symbols.

There are tradeoffs in selecting the parity packet size. If the packet size is small, the transmission of the parity packet is more robust but the header overhead increases. If a large packet size is used, the packet is more easily lost and also the loss of a single parity packet results in a loss of multiple parity rows. The maximum possible number of rows in each FEC parity, packets depends on row size U, maximum transmit unit (MTU) of the channel and desired level of robustness. The FEC information (used as padding in the video/source packets in accordance with the present invention) is necessary so that the receiver is able to correctly decode the coding block.

Figure 7A:
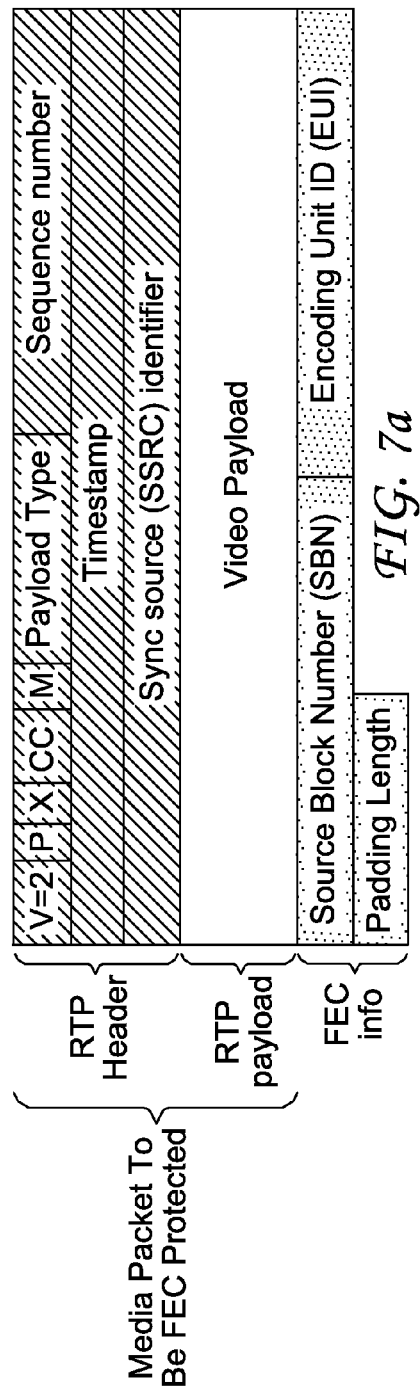
FIG. 7a shows a source RTP packet format in accordance with the present invention that can support hybrid padding.

FIG. 7a shows a source RTP packet format that can support hybrid padding in accordance with the packet format of the present invention. The original RTP header and payload field are unchanged from the non-FEC system. The original RTP header and payload are protected by FEC coding. Four bytes of FEC control information field are added to indicate the packet's source block number (SBN) and its position in that block, i.e. starting row number of this packet. The FEC information is used as RTP padding. The packet's format is similar to that defined in 3GPP specification but the FEC related control information is appended to the video packets as the RTP padding by the FEC encoding module in accordance with the present invention. In conventional video packets, FEC coding information was inserted after the RTP header and before the RTP payload (video data). By moving the FEC information as the RTP padding, the packet format is backward compatible with non-FEC capable mobile devices such as video players. The FEC control information is necessary for the FEC decoding module to decode the FEC block when the hybrid padding is used. Otherwise, the decoder would not know the number of rows for a lost video/source packet. According to the RTP standard RFC 3550, additional padding octets at the end should be ignored by the RTP de-packetizer if the padding bit is set in the RTP header. The last octet of the padding contains a count of how many padding octets should be ignored, including itself. So the non-FEC capable legacy players with the RTP padding support can just receive video multicast group and ignore the FEC control information in the padding. This FEC mechanism can be used in a multicast scenario with mixed FEC capable and non-FEC capable receivers because the original RTP source packets are unchanged except some padding information. The padding information should be ignored by the non-FEC capable players. Testing with several H.264 compliable players shows that this method works well with the VLC player and the Thomson MMAF player since these players support RTP padding. The Quicktime player cannot receive the video stream directly with FEC control information since it does not support padding.

Figure 7B:
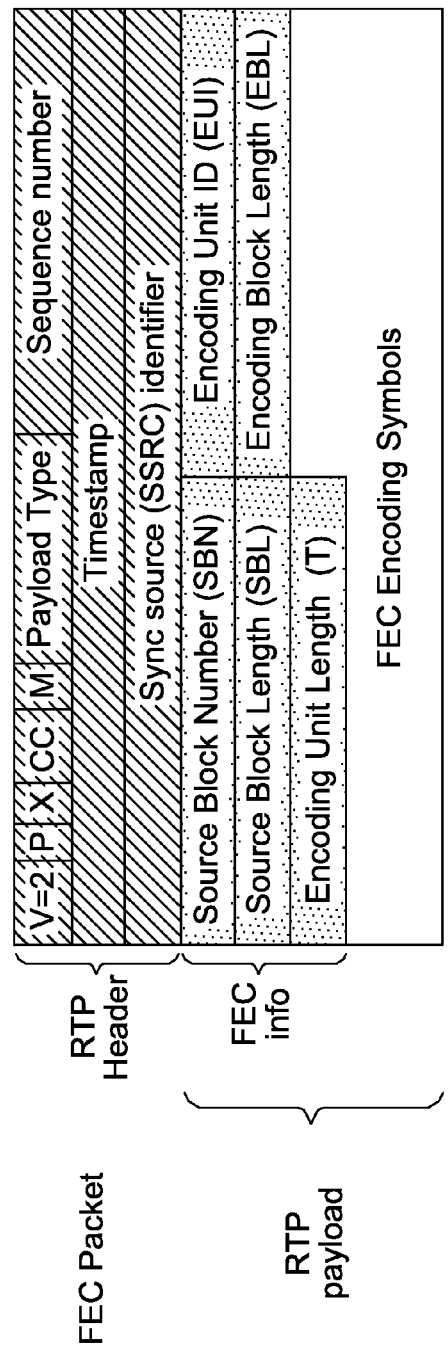
FIG. 7b shows a parity RTP packet format.

FIG. 7b shows a parity RTP packet format. Parity FEC packets are also sent out using UDP/IP protocol stack. The payload type (PT) of FEC parity packets is dynamically allocated using an out-of-band signaling mechanism e.g. SDP file, which is different from the original source payload type. The PT identifies the FEC coding scheme and its parameters for the payload. To aid in the decoding of the parity packets at the receiver, an FEC control information header is added following the RTP header to indicate the FEC block information and coding parameters. Similar to the format defined in 3GPP, the FEC header of a parity packet includes (1) Source Block Number (SBN): the ID of the source block to which the source packet belongs (2) Encoding Unit ED (EUI): the starting row number of this packet in the coding block (3) Source Block Length (SBL): the number of source rows in the source block, i.e. K (4) Encoding Block Length (EBL): the total number of rows, i.e. N (5) Encoding Unit Length (U): The length of a row in bytes. Note that each encoding unit corresponds to a row here.

The FEC decoding at the client side is a reverse process of encoding. The received source and parity packets belonging to a source block can be buffered together based on the SBN. If any missing source RTP packet is detected by a gap in the sequence numbers. The parity packet with the same SBN can be used to recover the lost video/source packet. If any parity packets are available, the FEC coding parameters (N, K), the dimensions of the source block and the row size can be determined by the FEC control information in the FEC parity packet. The coding block can be formed with possible missing rows due to lost source and FEC parity packets according to the EUI field, i.e. starting row number of the source and parity packets. The missing source rows can be decoded and recovered if the number of missing rows is less than (N−K). Note that before inserting the source RTP packets into the source rows, the packet length is pre-pended to the parity packet's first source row. This is useful in the recovery of the video/source packets. The first two bytes of the recovered packet will have its "PacketSize". Starting from the third byte, "PacketSize" number of bytes from the recovered source rows belongs to the packet. The remainder of the symbols in the row are discarded since they are padding symbols. Padded FEC control information and padding length byte are stripped from the correctly received video/source RTP packets before FEC decoding by the FEC decoding module.

Figure 8A:
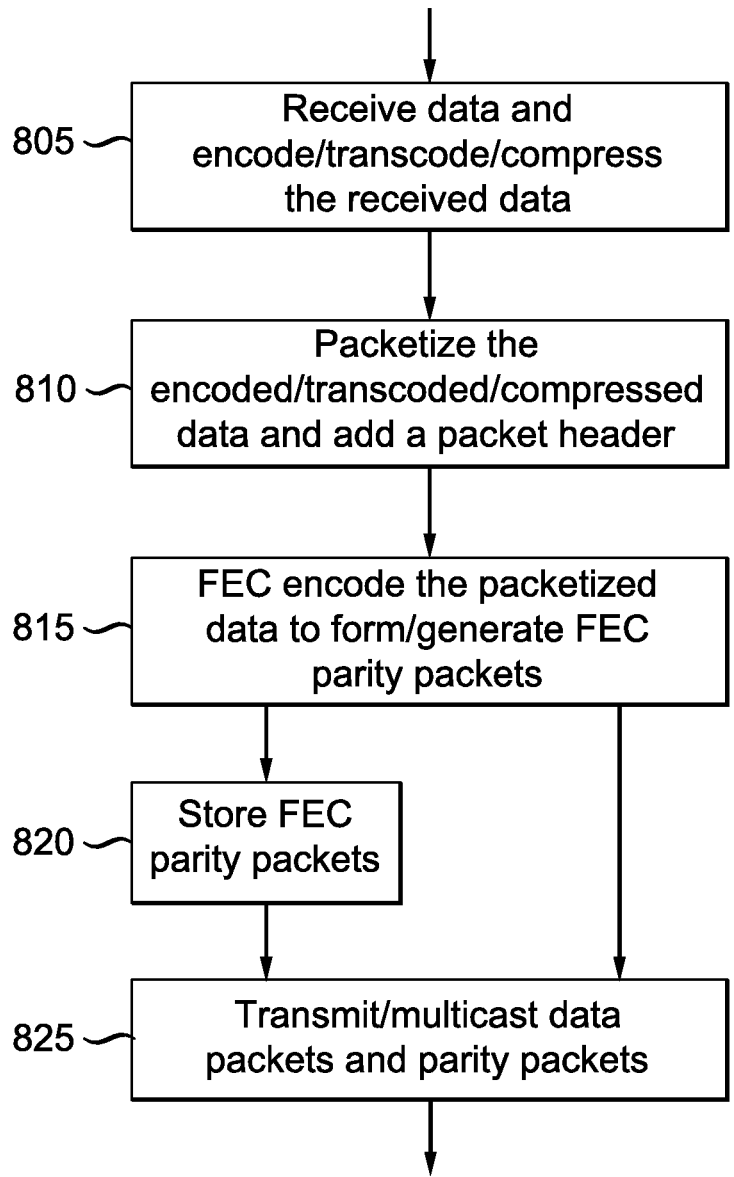
FIG. 8a is a flowchart of an exemplary video server/encoder implementation with parity packets generated by a cross-packet forward error correction (FEC) code in the delayed recovery multicast group in accordance with the principles of the present invention.

FIG. 8a is a flowchart of an exemplary transmitter/server implementation for video multicast over wireless IP networks using the FEC parity packets in the delayed recovery IP multicast group. Uncompressed video sequence data is received and encoded/transcoded/compressed at 805. The encoded/transcoded/compressed video sequence data is packetized and the packet header is added at 810. The packetized encoded/transcoded/compressed video sequence data is then FEC encoded at 815 to form FEC parity packets. The FEC codes are applied across video packets to generate the parity packets. The header is added in the FEC packets containing FEC information. The extra FEC related control information is also appended to the video data packets. The video data packets are then transmitted/multicast to an IP multicast group (normal video multicast group) at 825. The parity packets are stored at 820 for an offset time $T_d$. The FEC parity packets are transmitted/multicast to another IP multicast group (delayed/recovery multicast group) at 825 after a delay/time shift $T_d$.

Figure 8B:
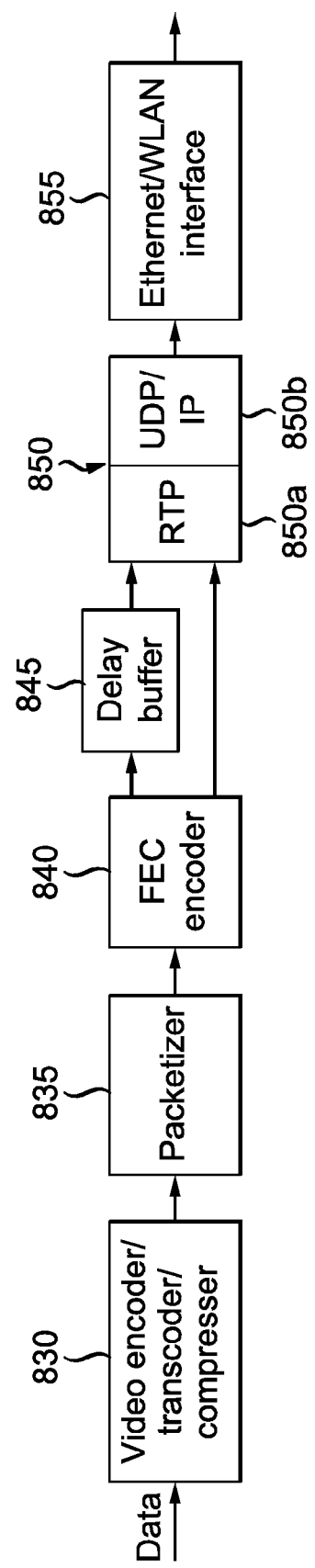
FIG. 8b is a schematic diagram of an exemplary video server/encoder implementation with parity packets generated by a cross-packet forward error correction (FEC) code in the delayed recovery multicast group in accordance with the principles of the present invention.

FIG. 8b is a schematic diagram of an exemplary transmitter/server implementation for video multicast over wireless IP networks using the FEC parity packets in the delayed recovery IP multicast group. Video encoder/transcoder/compresser 830 receives uncompressed video sequence data and encodes/transcodes/compresses the uncompressed video sequence data. The encoded/transcoded/compressed video sequence data is communicated to packetizer 835, which packetizes the encoded/transcoded/compressed video sequence data to form data packets and add the packet header. The packetized encoded/transcoded/compressed video sequence data is then communicated to FEC encoder 840 to form parity packets. The FEC encoder is placed after the packetization, but before the protocol stack 850. The FEC codes are applied across the video packets to generate the parity packets. The header is added in the FEC packets containing FEC information. The FEC related control information is also appended to the video data packets. The video data packets are immediately transmitted/multicast to an IP multicast group (normal video multicast group) through the protocol stack 850 and Ethernet/WLAN interface 855. The protocol stack 850 includes at least UDP layer 850a and IP layer 850b. The parity packets are stored in the delay buffer 845 for an offset time $T_d$. The FEC parity packets are transmitted/multicast to another IP multicast group (delayed/recovery multicast group) via the protocol stack 850 and Ethernet/WLAN interface 855 after a delay/time shift $T_d$. The components described herein may be hardware, software or firmware or any combination thereof including RISC, ASIC and/or FPGA.

For systematic FEC codes, the FEC encoding module waits for enough video/source packets to fill in the coding block, and then the FEC encoding module generates parity packets. In another embodiment the FEC encoding module can append the FEC related control information to a video/source packet and transmit/multicast the packet out immediately after the packet is passed to the FEC encoding module by the packtizer without waiting for the coding block to fill up. The FEC encoding module keeps a copy of this packet in the coding block buffer. After the coding block is filled and the FEC encoding module generates the parity packets as described above, the already transmitted video/source packets are discarded because the video/source packets have already been transmitted.

Figure 9:
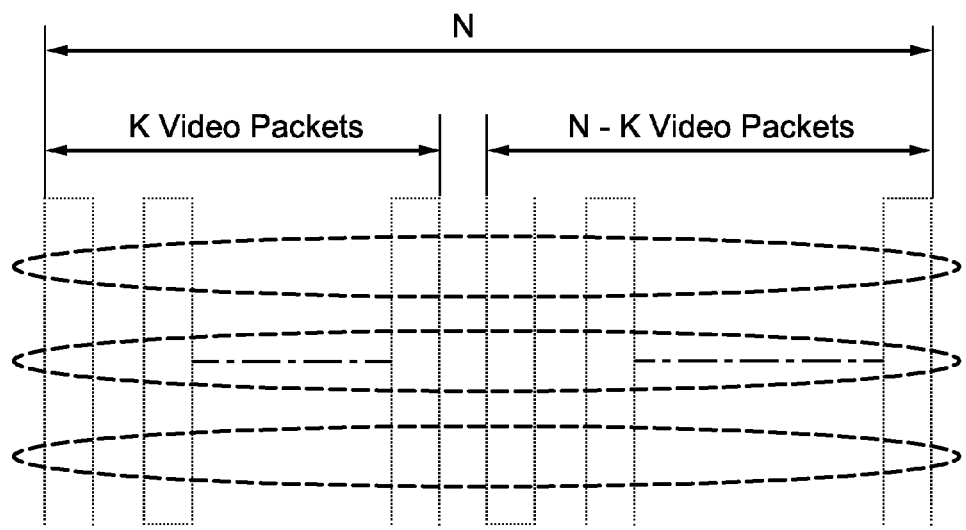
FIG. 9 is an example of cross-packet encoding in accordance with the principles of the present invention.

FIG. 9 is an example of cross-packet encoding in accordance with the principles of the present invention. As shown in FIG. 9, K video packets are grouped together and Reed-Solomon (RS) (N, K) code is applied to the packet group to generate N−K parity packets. The header is added to the FEC packets containing FEC information including which video packets this FEC packet protects. The FEC related control information is also appended to the video packets. The video data packets are transmitted to an IP multicast group (normal video multicast group) via the UDP/IP stack and Ethernet interface. The parity packets are then stored in a delay buffer for an offset time $T_d$. The FEC parity packets are transmitted to another IP multicast group (delayed/recovery multicast group) via the UDP/IP and Ethernet interface after a delay/time shift $T_d$.

Figure 10A:
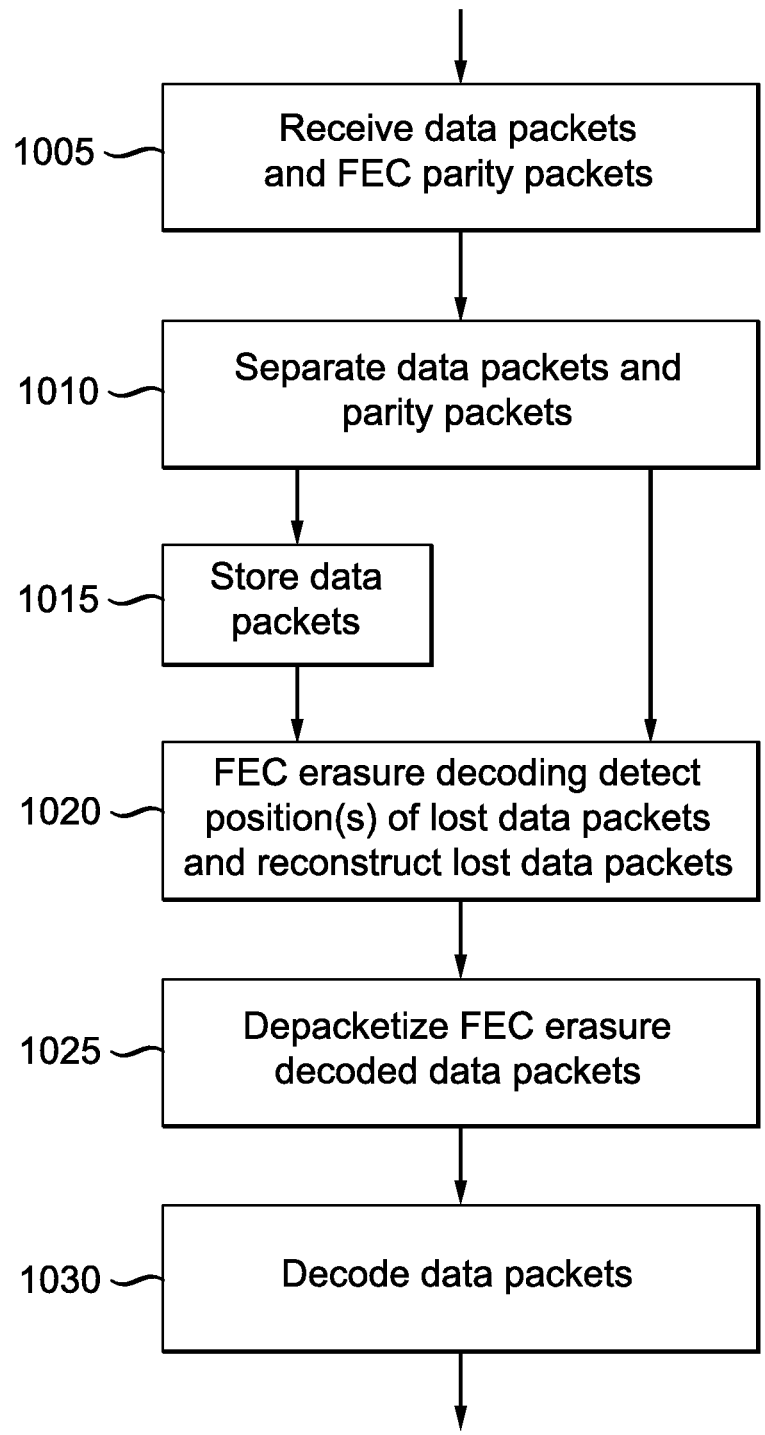
FIG. 10a is a flowchart of an exemplary mobile receiver implementation with parity packets generated by a cross-packet FEC code in the delayed recovery multicast group in accordance with the principles of the present invention.

FIG. 10a is a flowchart of an exemplary mobile receiver/device implementation for video multicast over IP-based wireless networks using the FEC parity packets in the delayed/recovery multicast group. Normal video data packets containing video sequence data and the delayed parity packets are received from different multicast groups at 1005. They are separated into video packets and parity packets at 1010. The received video data packets are stored at 1015. The erroneous video and parity packets are discarded by the link layer (WLAN interface). FEC erasure decoding is performed at 1020. The positions of lost video data packets or parity packets are detected through the sequence number in the packet header by the FEC erasure decoding process. The FEC header in the parity packets and the FEC control information appended in the video data packets is used to determine the FEC block information. With the RS (N, K) code, as long as any K or more packets out of N packets in the FEC coding block (regardless whether video data packets or parity packets) are correctly received, the FEC erasure decoding process can reconstruct the original (normal) video packets. The FEC erasure decoded video data packets are depacketized at 1025. The depacketized video data packets are then video decoded at 1030 to produce decoded video for display.

One embodiment uses a half-rate RS code. The half-rate RS code is used to generate another description of the original data. For the RS code with erasure decoding, each parity packet can recover any one lost packet in the coding block. When a half-rate RS (N, K) code (N=2K) is applied to the K video packets, it generates K parity packets. With the half-rate RS code, even if multiple video data packets are completely lost in a burst during handover, the lost data packets can be recovered from the corresponding parity packets alone. In this sense, the parity packet stream generated by the half-rate RS code is an alternative to the original (normal) video packet stream. It should be noted that besides Reed-Solomon (RS) codes, other FEC codes can also be used to generate parity packets. The present invention with half rate RS code can transparently tolerate packet loss up to the duration of the time shift $T_d$ between the original video packets and the FEC parity packets.

Figure 10B:
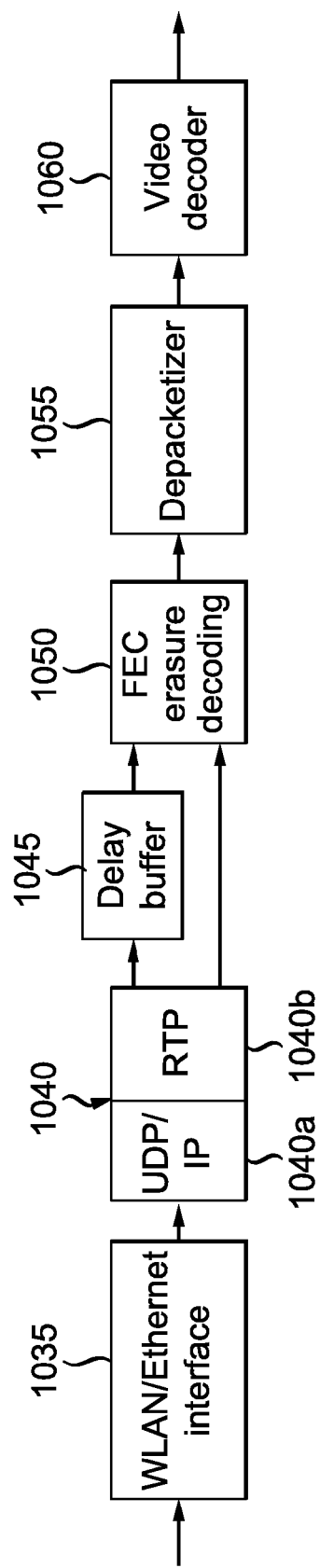
FIG. 10b is a schematic diagram of an exemplary mobile receiver implementation with parity packets generated by a cross-packet FEC code in the delayed recovery multicast group in accordance with the principles of the present invention.

FIG. 10b is a schematic diagram of an exemplary mobile receiver/device implementation for video multicast over IP-based wireless networks using the FEC parity packets in the delayed/recovery multicast group. Normal video data packets and the delayed parity packets are received from different multicast groups at the WLAN/Ethernet interface 1035. They are separated into video data packets and parity packets by protocol stack 1040, which includes at least UDP layer 1040a and IP layer 1040b. The received video data packets are delayed in buffer 1045. The erroneous video and parity packets are discarded by the link layer (WLAN interface). The FEC erasure decoding module 1050 is between the de-packetization and UDP layer. The positions of lost video data packets or parity packets are detected through the sequence number in the packet header by the FEC erasure decoding module 1050, which is used for erasure decoding. The FEC header in the parity packets and the FEC control information appended in the video packets is used by FEC erasure decoding module 1050 to determine the FEC block information. With the RS (N, K) code, as long as any K or more packets out of N packets in the FEC coding block (regardless whether video data packets or parity packets) are correctly received, the FEC erasure decoding module 1050 can reconstruct the original (normal) video data packets. The FEC erasure decoded video data packets are communicated to depacketizer 1055, which depacketizes the video data packets. The depacketized video data packets are then communicated to video decoder module 1060. The components described herein may be hardware, software or firmware or any combination thereof including RISC, ASIC and/or FPGA.

If no return wireless channel from the mobile device to the BS/AP is available and/or a simple system implementation is preferred, the BS/AP may always transmit the normal video stream and delayed recovery stream in multicast over the wireless networks. The mobile receiver/device receives both streams without requesting them. For the recovery of random packet loss, it is also possible to always transmit certain FEC parity packets in another multicast group without time shift according to the channel conditions. The remaining FEC parity packets are transmitted in the delayed recovery (FEC) multicast group to correct burst packet loss.

Using the ORBIT wireless network testbed, the impact of FEC overhead and the delay between the video stream and FEC streams to the video quality under different interference levels and mobile handover times was investigated. The effectiveness of the FEC staggercasting of the present invention was proved using experimental data from the Orbit testbed. All video sequences were H.264 encoded. Video resolution was 720×480 and the frame rate was 24 frames per second. There was one 1 frame every 2 seconds. The instantaneous decoder refresh (IDR) intra pictures were disabled. Slice mode was used in the encoder and each packet carried one and only one slice to ensure that each lost packet would not affect the effectiveness of other correctly received packets and prevent error propagation.

Figure 11A:
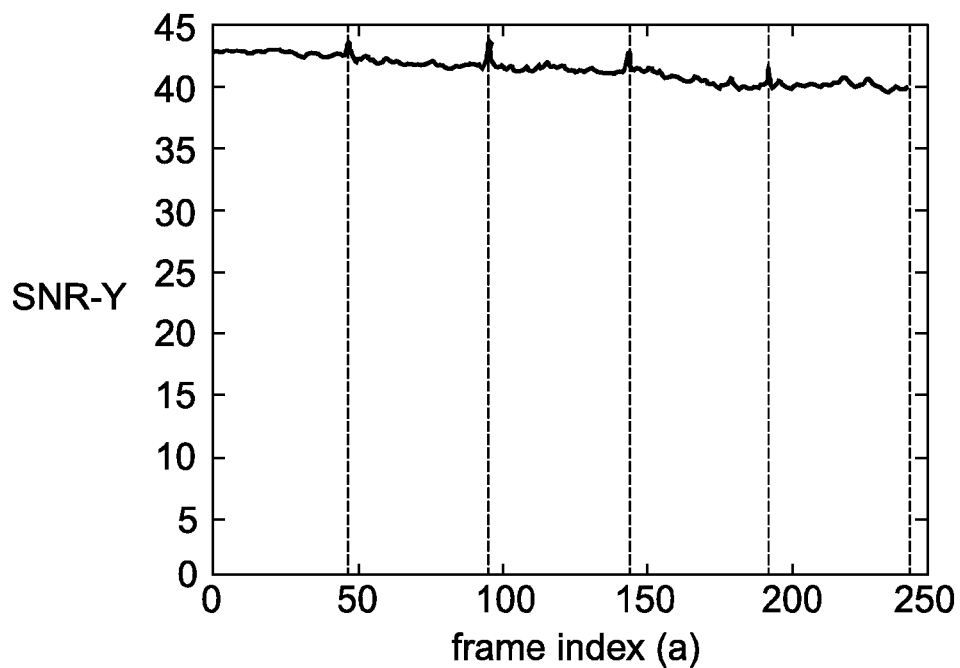
FIG. 11a shows the luminance SNR (SNR-Y) for every frame in the original 10 second long video sequence.
Figure 11B:
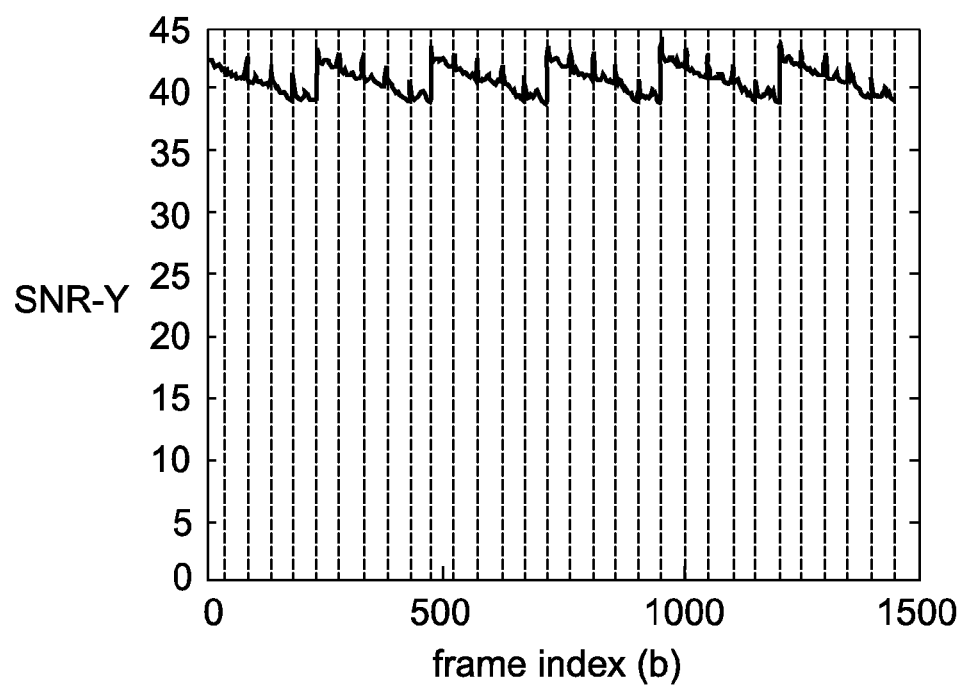
FIG. 11b shows the luminance SNR (SNR-Y) for the looped 1 minute long video sequence.

A medium motion video sequence "Kungfu" was selected for the tests. The original video was 10 seconds in length, which means there were 240 frames with 51 frames. FIG. 11a shows the luminance component Signal to Noise Ratio (SNR-Y) of the video sequence after encoding with quantization parameters of I/P frames both set to 27 and a slice size of 450 bytes. The periodical pulses every 48 frames show the location of I frames, which are also shown by the dashed vertical grid. The SNR-Y of the 240 frames decreases a little gradually because the motion in the video sequence increases. The original video sequence is looped 6 times to get a 1440 frame (1 minutes) sequence. The SNR for the luminance component of the 1 minute sequence shows a seesaw form as in FIG. 11b.

Next the effectiveness of FEC protection for video multicast in noisy environment was tested using the Orbit testbed. The original 10 second long video sequence was looped 30 times to get a 5 minute long sequence. The video was sent in multicast using IEEE 802.11a channel 64 and mode 1. The transmission power was set to 15 mW to make it more vulnerable to noise interference. The noise generator on the Orbit testbed was used to generate AWGN interference centered on channel 64 with a bandwidth of 20 MHz. The client was associated with the BA/AP to receive the FEC and non-FEC protected video sequences. The received video data were decoded to compare their video quality.

For fair comparison, 5 video sequences were encoded from the same raw video using different quantization parameters to get similar overall (RTP packets and FEC packets) traffic bit rates under different FEC coding rates. Table 1 shows the encoding parameters and overall bit rates for the five video sequences used in FIG. 12. The UDP/IP/MAC/PHY header overhead is included in the traffic statistics in Table 1.

TABLE 1

H.264 Main Profile Encoded Video Sequences (slice size 1420 bytes)

| Sequence Name | A | B | C | D | E |
|---|---|---|---|---|---|
| Slice Size(bytes) | 1420 | 1420 | 1420 | 1420 | 1420 |
| Quantization Parameter for I slices | 27 | 28 | 30 | 32 | 33 |
| Quantization parameter for P Slices | 26 | 29 | 31 | 32 | 33 |
| Avg. SNR-Y | 40.11 | 38.96 | 37.85 | 37.12 | 36.66 |
| FEC code rate | 0 | 25% | 50% | 75% | 100% |
| RTP Traffic (kbps) | 1312.924 | 936.0412 | 742.3854 | 631.9408 | 564.721 |
| FEC Traffic (kbps) | 0 | 269.9815 | 456.8451 | 578.06376 | 678.2906 |
| Overall Traffic (kbps) | 1312.924 | 1206.0227 | 1199.2305 | 1210.00456 | 1243.0116 |

Figure 12:
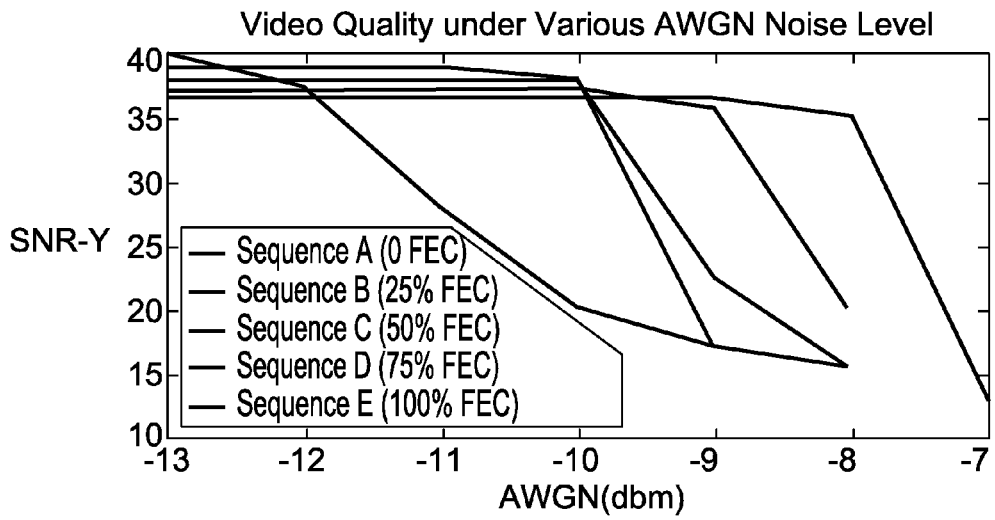
FIG. 12 shows the average SNR-Y for the sequences in Table 1 under various interference levels.

FIG. 12 shows the average SNR-Y for the sequences in Table 1 under various interference levels. For each case, the video quality rapidly degrades as the interference exceeds a threshold. This is because in each coding block the FEC parity packets recover either all lost packets or none of the lost packets. There is also error propagation in the video sequence. The threshold of the curve occurs at a higher interference level for more powerful FEC codes. However, the SNR-Y is slightly lower for stronger FEC codes at low interference level when there is little error. This is because the higher overhead required by stronger FEC codes reduces the video source rate. In the experiments, when the interference is low (13 dbm noise), it can be seen that, due to the FEC redundancy, the higher the FEC overhead, the less the video quality. But as the noise increases, the FEC protection shows its effectiveness. When the noise reaches around 7 dbm, some of the received sequences were not decodable due to large packet loss. Experimental data shows that when the noise reached 6 dbm, none of those 5 received sequences was decodable any longer. When the noise was 5 dbm, the association between the BS/AP and the client was intermittently broken. Normally, an operation point with a source coding rate for good video quality and sufficient FEC protection to recover from packet loss based on desired video multicast coverage range can be chosen.

Figure 13:
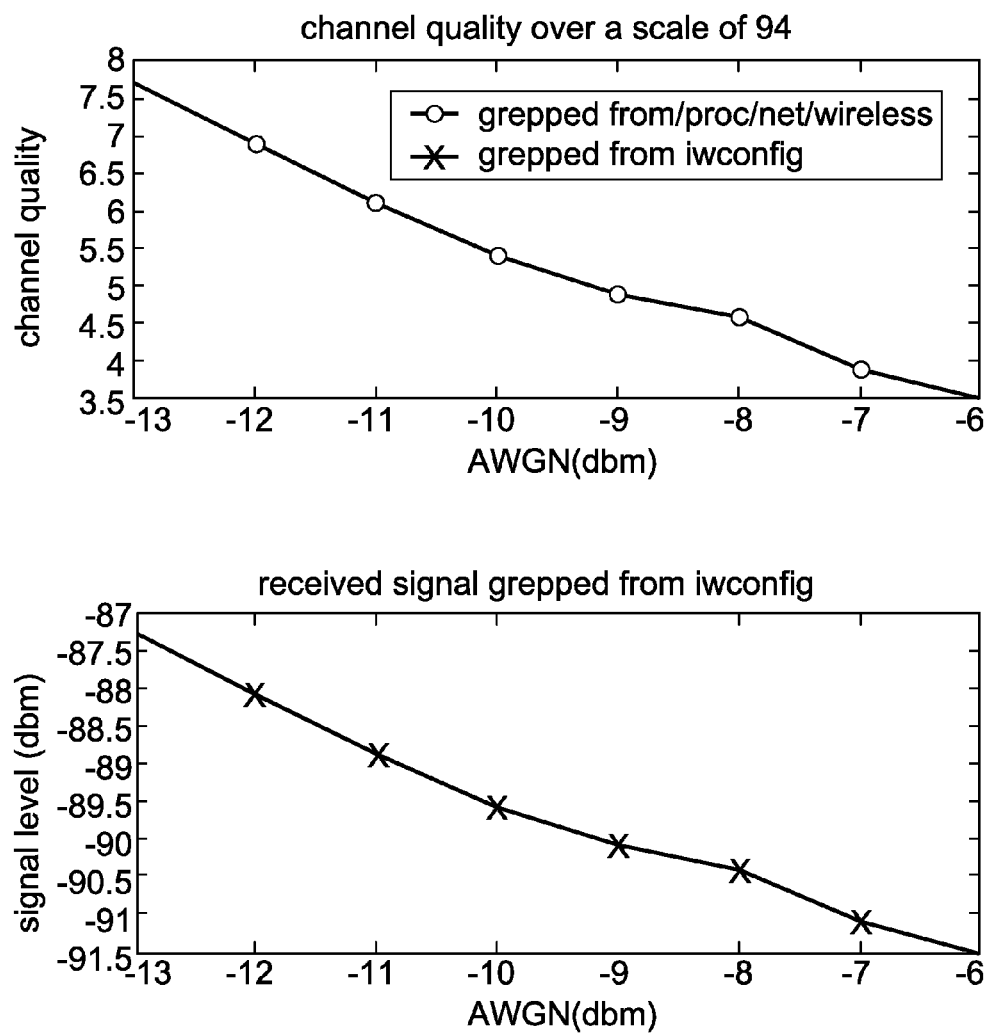
FIG. 13 shows the corresponding link quality sensed by the client in two forms.

FIG. 13 shows the corresponding link quality sensed by the client in two forms: a number over a scale of 94, and received signal strength in dbm. FIG. 13 shows a linear relationship between the interference level and the link quality sensed by the client.

Figure 14:
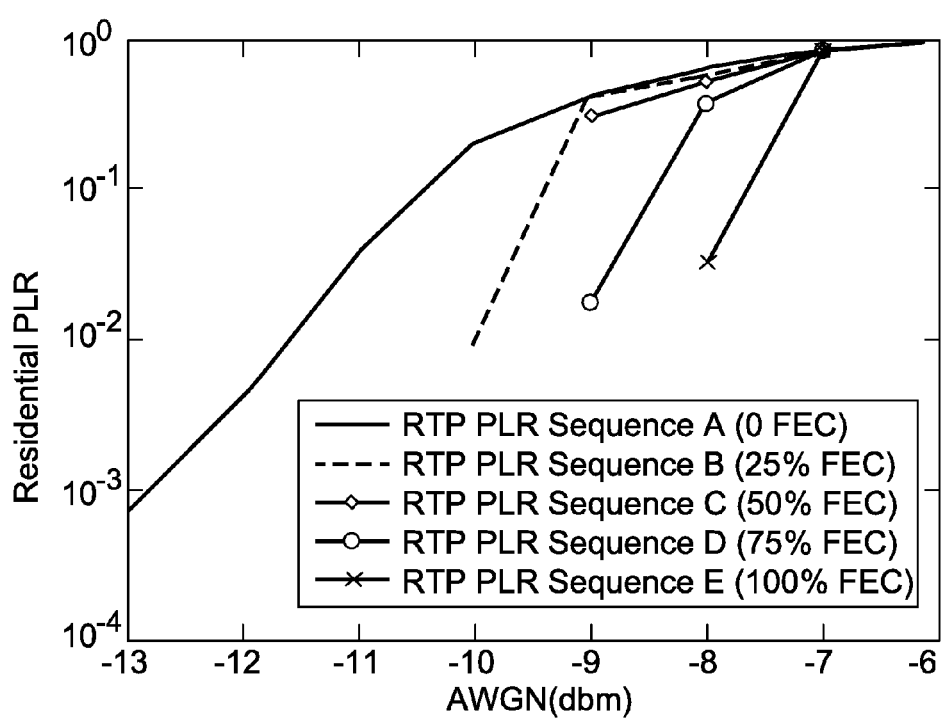
FIG. 14 shows the residual packet loss rate PLR under various interference levels.

FIG. 14 shows the residual packet loss rate PLR under various interference levels. In each case, the PLR rapidly increases as the interference exceeds a threshold. As mentioned before, this is because FEC corrects either all errors or no errors. The threshold of the curve occurs at a higher interference level for more powerful FEC codes.

For block FEC, the FEC encoder always waits for enough video packets to fill in K symbols of a coding block, and then the FEC encoder generates (N−K) parity packets and transmits the parity packets. There is thus always a spreading/delay between FEC packet transmission time and source packet transmission time, which depends on the coding unit size T, source symbol number K and original video traffic pattern. This intrinsic spreading (?delay) is hard to manage and calculate. Table 2 shows the sequences used in the staggered FEC experiments. Sequence G is with 100% FEC protection and sequence F is without any FEC protection. For a fair comparison, two video sequences were encoded from the same "KungFu" raw video using different quantization parameters to get similar overall bandwidth usage. The video sequence was looped long enough to accommodate 5 handoffs (burst duration). Again the UDP/IP/MAC/PHY headers were included in the traffic statistics.

TABLE 2

H.264 main profile encoded video sequences

| Sequence Name | F | G |
|---|---|---|
| Slice Size(bytes) | 450 | 450 |
| Quantization parameters | 27 | 34 |
| Avg. SNR-Y | 40.1 | 36.02 |
| FEC code rate | 0 | 100% |
| Video Traffic (kbps) | 1399.9076 | 578.206 |
| Parity Traffic (kbps) | 0 | 648.2268 |
| Overall Traffic (kbps) | 1399.9076 | 1226.4328 |

Figure 15A:
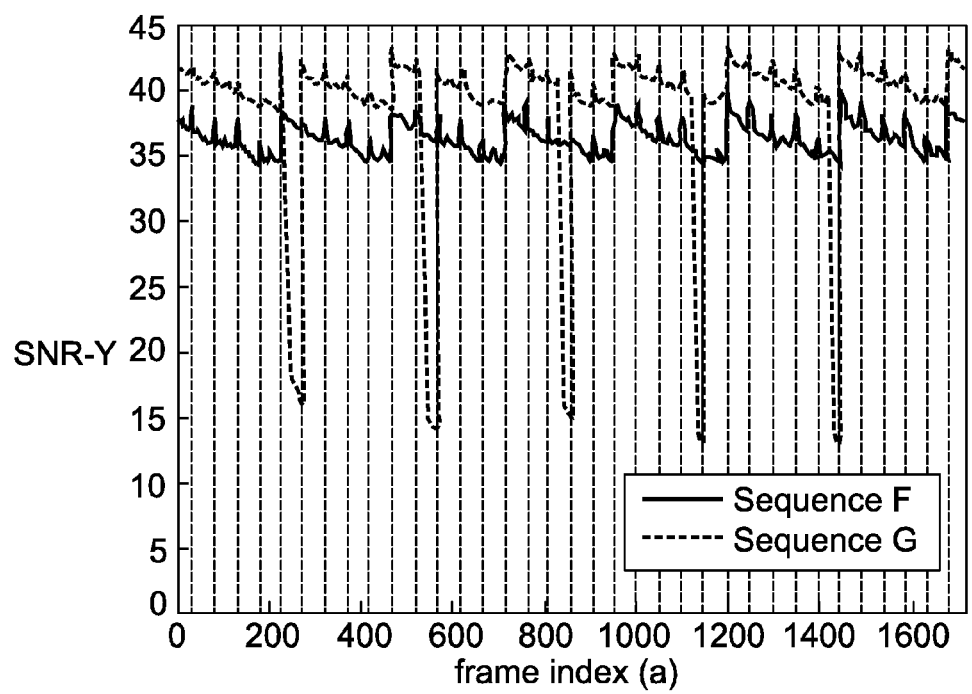
FIG. 15 shows the video quality for sequences F and G with different FEC delay and handoff/burst durations.

The length of the handoff (burst) duration and the nature of packets (whether they belong to I frames or P frames) lost during handoff/burst were two important factors that effected the received video quality. In the tests performed, the FEC parity stream was delayed with a value of 0 second, 1 second and 2 seconds respectively to the original video stream in addition to the intrinsic spreading (?delay). The received video quality under various handoff durations was calculated and they were compared to show the effectiveness of staggered FEC multicast. FIG. 15(a) shows the video quality of sequences F and G when the handoff duration was 0.2 second and the FEC stream was delayed 0 second, which means the FEC packets were sent out immediately upon generation. For sequence F without FEC, the video quality degraded dramatically during handoffs/bursts. The sequence G with FEC protection was completely recovered at the receiver even without extra FEC delay. This is due to the error correction capability of strong FEC, a relatively short burst of packet loss during small handoff/burst duration, as well as the intrinsic spreading (?delay) of FEC packet transmission time and source packet transmission time as mentioned above.

Another interesting point shown in FIG. 15(a) is that no matter where the handoff/burst loss started, the video quality was always completely recovered until the next I frame (whose location is indicated by the vertical dashed lines) was correctly received. This may depend on the error concealment scheme used in the video decoder. A frame copy error concealment is used in the experiments. Although the five handoffs/bursts were of the same duration (all were 0.2 second) in FIG. 15(a), the width of the quality glitches were different because of the different handoff/burst starting point with respect to the next I frame. The differences were more distinct in FIG. 15(b), where in the third handoff/burst an I frame was lost and the video quality was completely recovered until the next I frame was correctly received 2 seconds later.

Figure 15B:
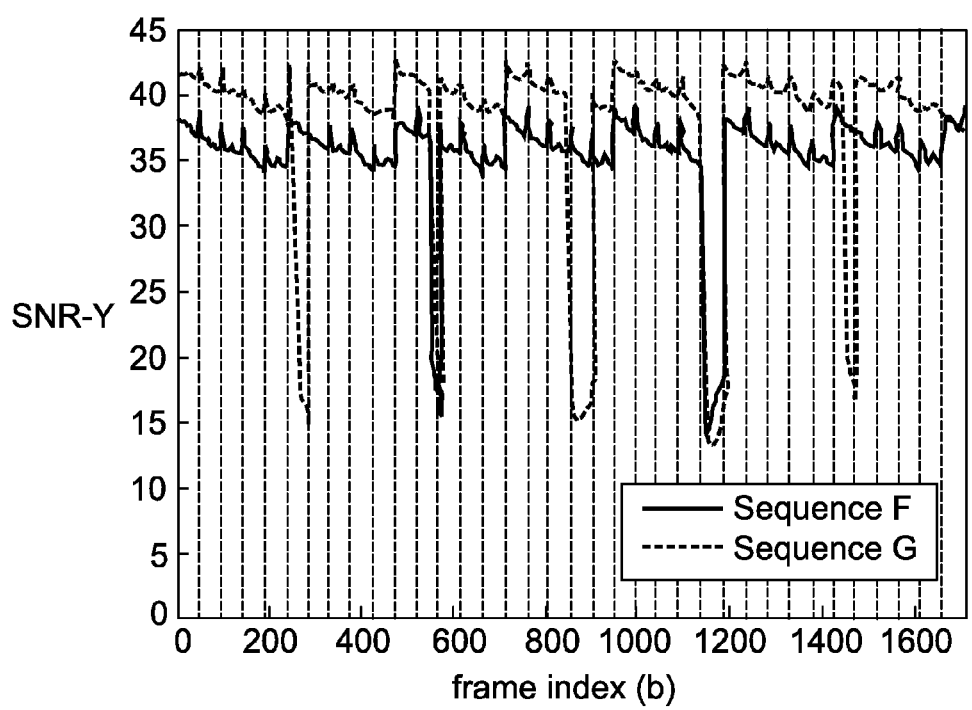

FIG. 15(b) shows the video quality of sequences F and G when the handoff intervals were 0.5 second and the FEC stream was delayed 0 second. In FIG. 15(b) some of the handoff loss burst was more than what FEC without delay could handle so that there were video quality degradation in the FEC protected video sequence G. As the handoff/burst duration increases, more packets were lost during handoff/burst. Lost packets cannot be recovered even with strong FEC if there is no delay between video and parity streams.

Figure 15C:
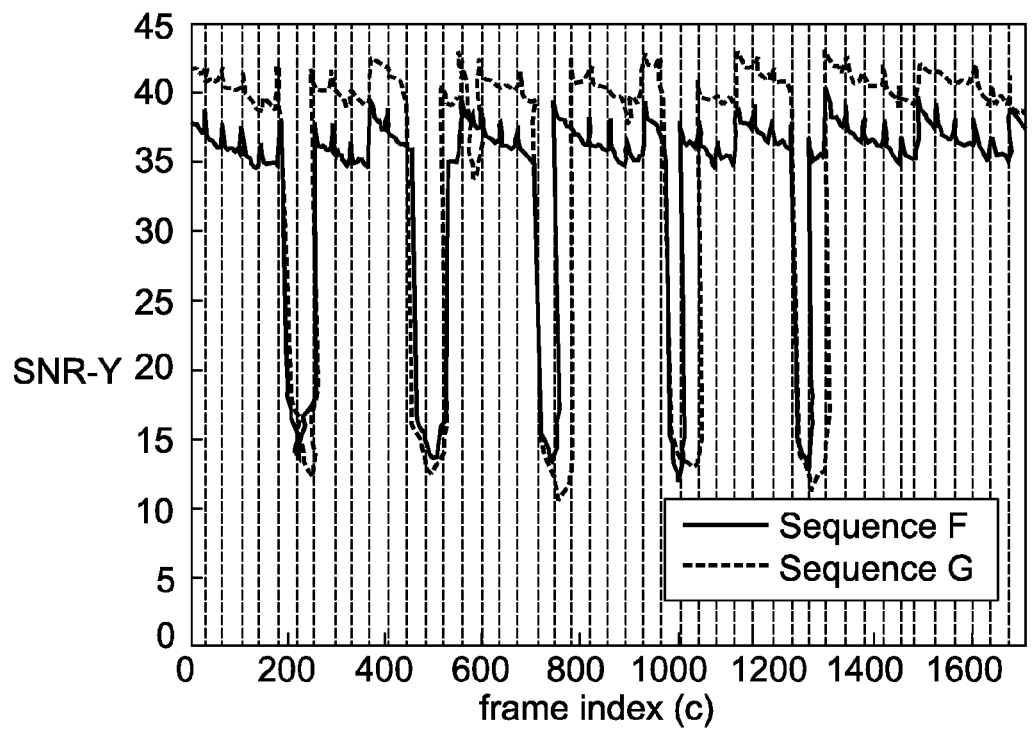

FIG. 15(c) shows the video quality of sequences F and G when the handoff duration was 1.8 seconds and the FEC delay 0 second. Another interesting point shown in FIG. 15(c) is that the last 3 quality glitches of sequence G (with FEC protection) were thinner than those of sequence F (without FEC protection). That is because some source RTP packets from 2 consecutive blocks were lost during handoffs/bursts. Those from the first block could not be recovered because their FEC packets got lost during handoffs/bursts as well. Those from the second block were recovered because their FEC packets were correctly received.

Figure 15D:
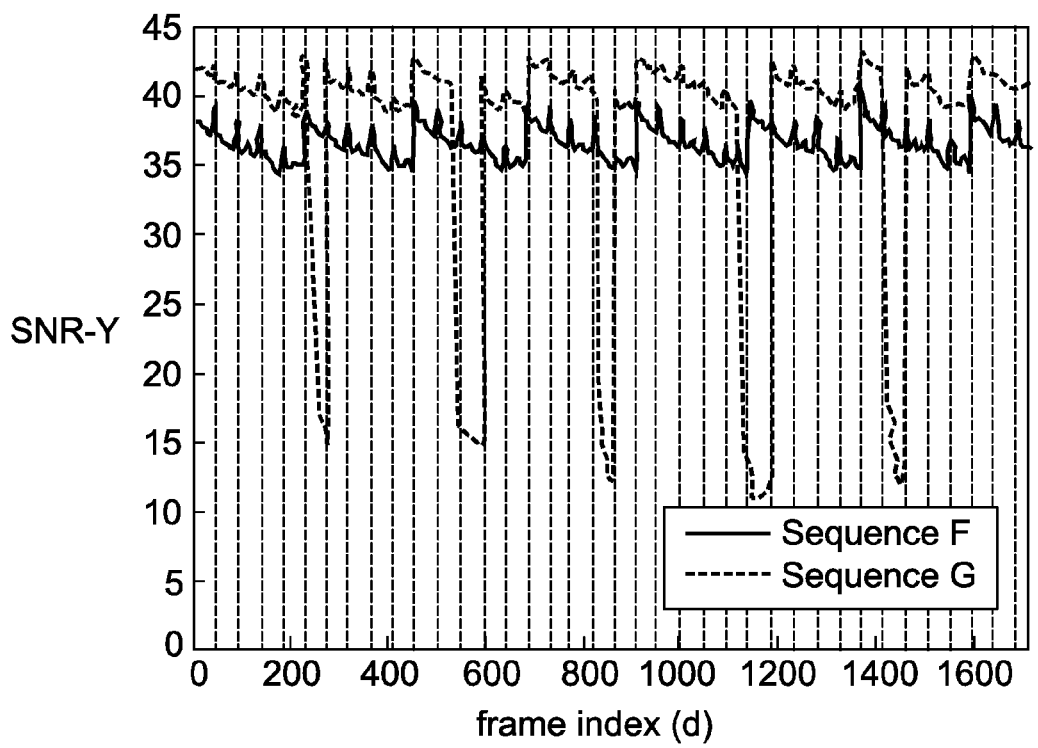

FIG. 15(d) shows the quality comparison between video sequences F and G. The FEC delay was increased to 1 second. FIG. 15d shows that a 1 second FEC delay is enough to recover handoff/burst duration of 0.8 second. But as the handoff/burst duration increases over FEC delay, the received video quality could no longer be guaranteed.

Figure 15E:
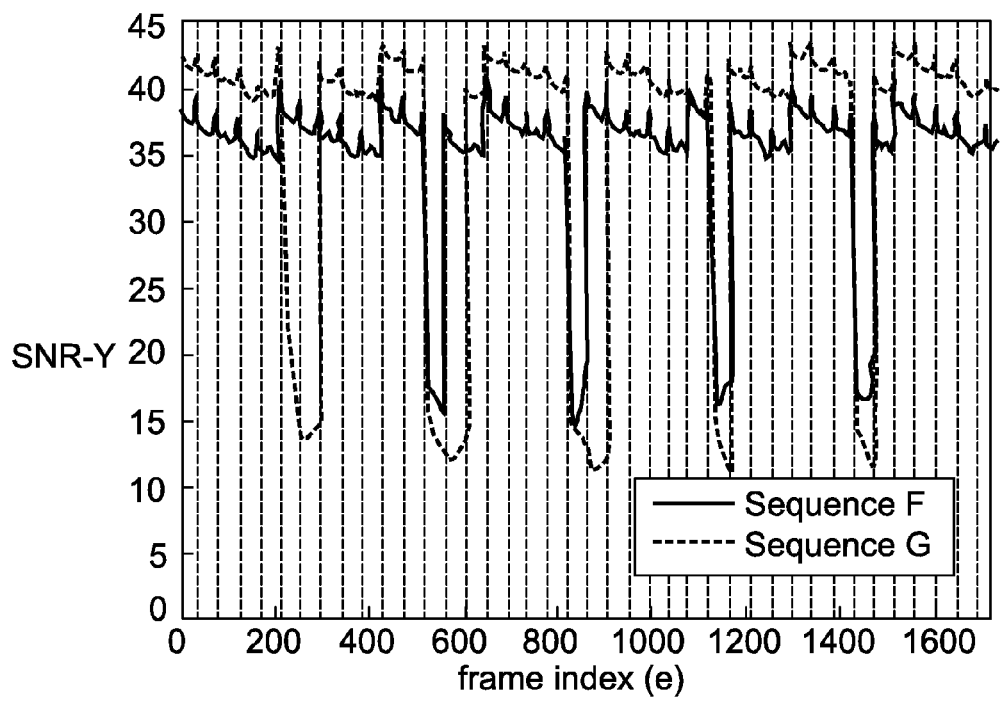

FIG. 15(e) shows the quality comparison between video sequences F and G when the handoff/burst duration was set to around 1.8 seconds, where 1 second FEC delay was no longer sufficient.

Figure 15F:
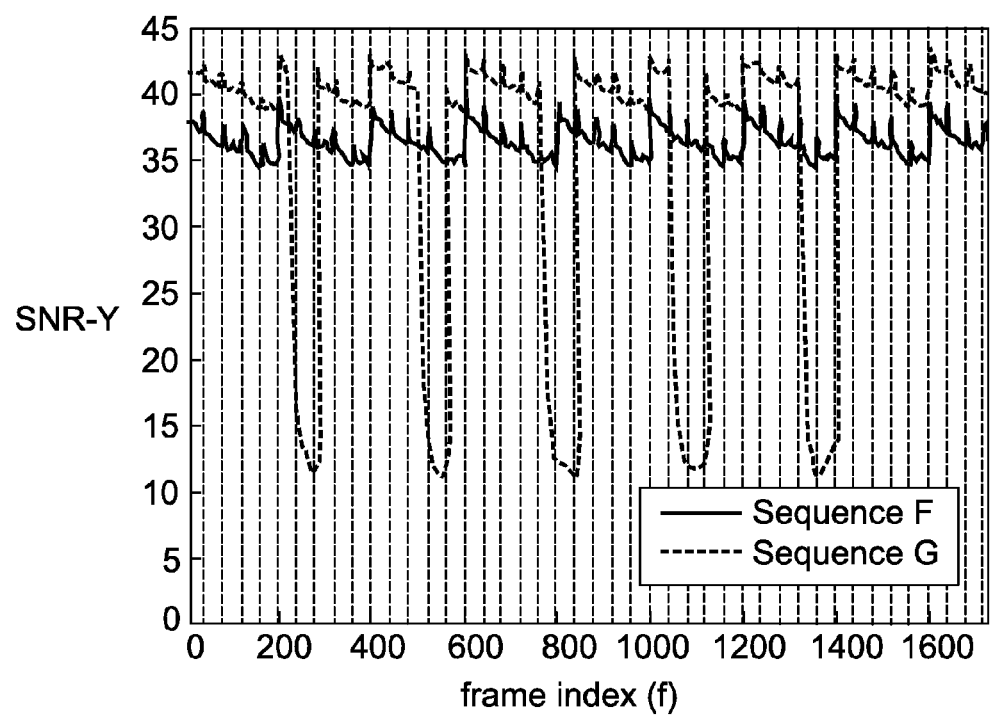

FIG. 15(f) shows the quality comparison between video sequences F and G. The FEC delay was increased to 2 seconds. This time there was no quality loss for sequence G during the handoff/burst. Note that a half rate RS code (N=2K) was applied in this handoff/burst experiment. The parity packet stream generated by the half rate RS code was another description of the original video packet stream. Even if all video packets were lost in a burst during handoff, the lost packets could be recovered from the corresponding parity packets alone. The system can guarantee recovery from the burst packet loss up to the duration of time shift between the video stream and parity stream without additional random packet loss.

Figure 16:
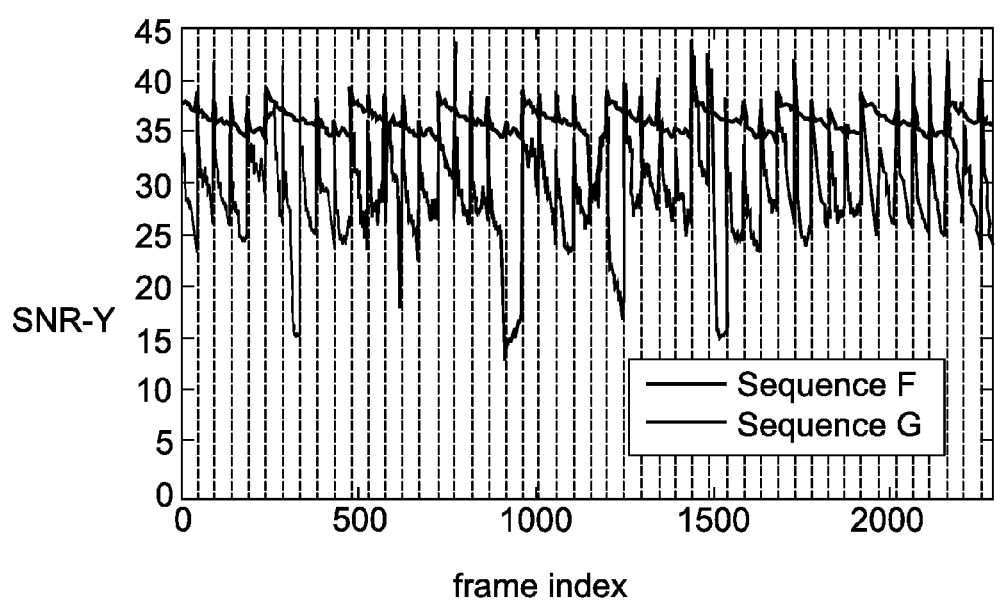
FIG. 16 shows the quality comparison between sequences F and G.

The effectiveness of FEC staggercasting is demonstrated more distinctively when sequences F and G were transmitted in an AWGN environment with handoff duration of 0.2 second. FIG. 16 shows the quality comparison between sequences F and G. In FIG. 16, the video quality of sequence F totally lost its shape whereas the quality of sequence G only shows minor degradation.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof), which is executed via the operating system. In addition, various other peripheral devices may be connected to the computer platform such as an additional data storage device and a printing device.

It is to be further understood that, because some of the constituent system components and method steps depicted in the accompanying figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

The invention claimed is:

1. A method for transmitting data, said method comprising:
   packetizing said data;
   performing forward error correction (FEC) encoding on said packetized data in order to generate a parity packet;
   appending FEC control information as padding to the end of payload data of said packetized data, said FEC control information including a padding length, a source block number and an encoding unit ID, the padding length indicating an amount of octets forming the FEC control information;
   transmitting said packetized data including the FEC control information, enabling backward compatibility with non-FEC systems, and said parity packet.

2. The method according to claim 1, further comprising delaying transmission of said parity packet for a pre-determined time period after transmission of said packetized data.

3. The method according to claim 1, wherein said transmitting act is accomplished using a user datagram protocol (UDP)/internet protocol (IP) stack and wireless local area network interface.

4. A system for transmitting data, comprising:
   means for packetizing said data;
   means for performing forward error correction (FEC) encoding on said packetized data in order to generate a parity packet;
   means for appending FEC control information as padding to the end of payload data of said packetized data, said FEC control information including a padding length, a source block number and an encoding unit ID, the padding length indicating an amount of octets forming the FEC control information;
   means for transmitting said packetized data including the FEC control information, enabling backward compatibility with non-FEC systems, and said parity packet.

5. The system according to claim 4, further comprising means for delaying transmission of said parity packet for a pre-determined offset time period after transmission of said packetized data.

6. The system according to claim 4, wherein said means for appending FEC information as padding to the end of payload data of said packetized data is performed by a FEC encoding module.

7. The system according to claim 4, wherein said means for performing FEC encoding on said packetized data in order to generate a parity packet is performed by a FEC encoding module.

\* \* \* \* \*